United States Patent
Sato

(10) Patent No.: US 9,954,091 B2
(45) Date of Patent: Apr. 24, 2018

(54) COMPOUND SEMICONDUCTOR DEVICE AND METHOD OF MANUFACTURING THE SAME

(71) Applicant: FUJITSU LIMITED, Kawasaki-shi, Kanagawa (JP)

(72) Inventor: Motonobu Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 1 day.

(21) Appl. No.: 15/289,534

(22) Filed: Oct. 10, 2016

(65) Prior Publication Data
US 2017/0125568 A1    May 4, 2017

(30) Foreign Application Priority Data
Nov. 2, 2015    (JP) ................. 2015-216035

(51) Int. Cl.
| | | |
|---|---|---|
| H01L 21/00 | (2006.01) | |
| H01L 29/778 | (2006.01) | |
| H01L 29/66 | (2006.01) | |
| H01L 21/324 | (2006.01) | |
| H01L 21/265 | (2006.01) | |
| H01L 29/51 | (2006.01) | |
| H01L 29/423 | (2006.01) | |
| H01L 29/20 | (2006.01) | |
| H01L 29/207 | (2006.01) | |

(52) U.S. Cl.
CPC ...... *H01L 29/7787* (2013.01); *H01L 21/2654* (2013.01); *H01L 21/324* (2013.01); *H01L 29/51* (2013.01); *H01L 29/66462* (2013.01); *H01L 29/2003* (2013.01); *H01L 29/207* (2013.01); *H01L 29/4236* (2013.01)

(58) Field of Classification Search
None
See application file for complete search history.

(56) References Cited

U.S. PATENT DOCUMENTS

| | | | |
|---|---|---|---|
| 2007/0114569 A1 | 5/2007 | Wu et al. | |
| 2007/0249119 A1 | 10/2007 | Saito | |
| 2008/0135880 A1* | 6/2008 | Yoshida | ............... H01L 29/408 257/194 |
| 2010/0041188 A1 | 2/2010 | Wu et al. | |
| 2011/0220966 A1 | 9/2011 | Wu et al. | |

(Continued)

FOREIGN PATENT DOCUMENTS

| | | |
|---|---|---|
| JP | 2007-027276 | 2/2007 |
| JP | 2007-294528 | 11/2007 |
| JP | 2008-218696 | 9/2008 |

(Continued)

*Primary Examiner* — Reema Patel
(74) *Attorney, Agent, or Firm* — Fujitsu Patent Center

(57) ABSTRACT

A compound semiconductor device includes: a substrate; a channel layer over the substrate; a carrier supply layer over the channel layer; a gate electrode, a source electrode and a drain electrode above the channel layer and the carrier supply layer; and an insulating film that covers the carrier supply layer between the source electrode and the drain electrode. The insulating film includes: a first region that contains anion under the gate electrode; and a second region on the source electrode side or on the drain electrode side of the first region, an anion concentration in the second region being lower than an anion concentration in the first region.

8 Claims, 19 Drawing Sheets

(56) References Cited

U.S. PATENT DOCUMENTS

2012/0032232 A1\* 2/2012 Iwabuchi ............... B82Y 10/00
  257/194
2013/0256686 A1\* 10/2013 Kanamura ............ H01L 29/205
  257/76

FOREIGN PATENT DOCUMENTS

| JP | 2009-507396 | 2/2009 |
| JP | 2010-186943 | 8/2010 |
| JP | 2013-207274 | 10/2013 |

\* cited by examiner

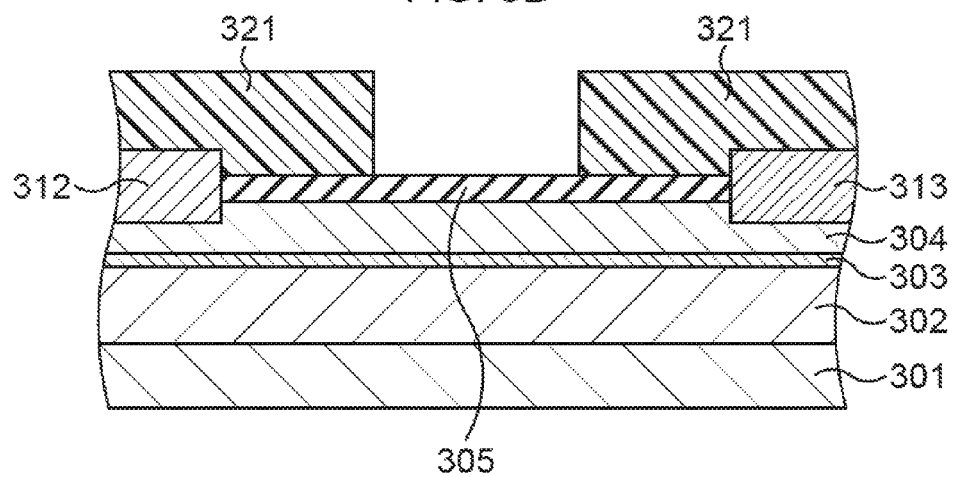
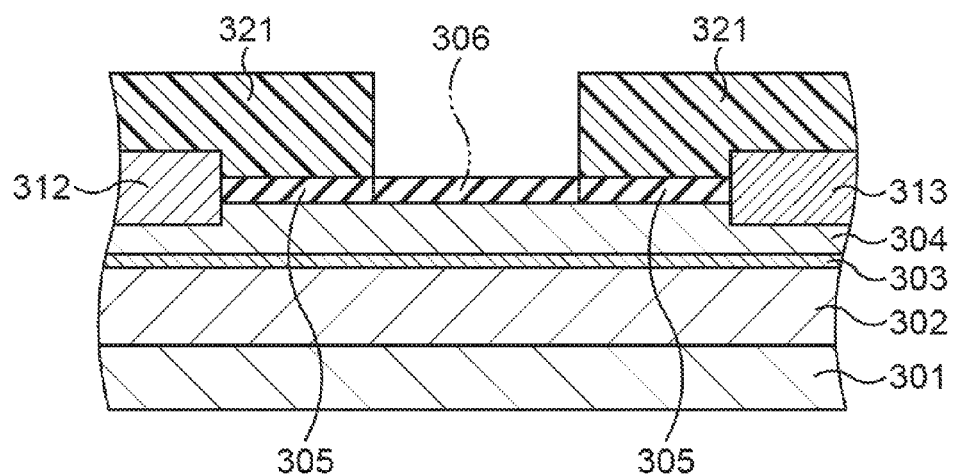
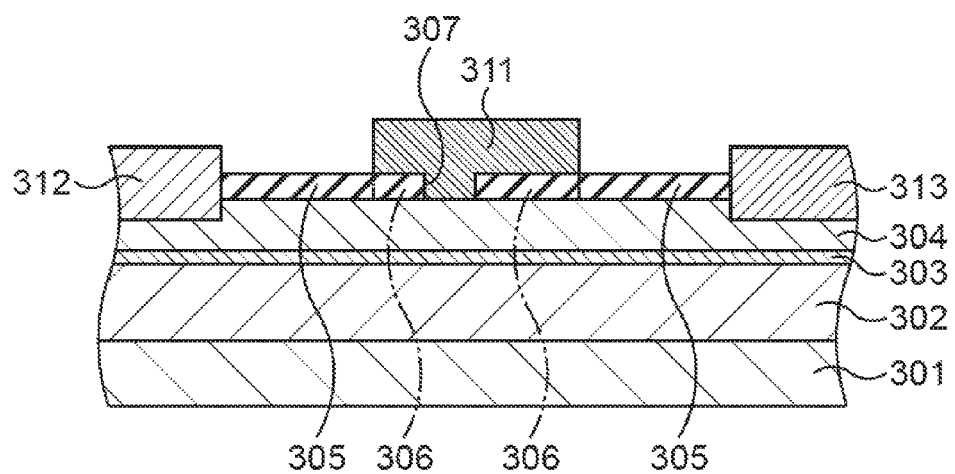

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2015-216035, filed on Nov. 2, 2015, the entire contents of which are incorporated herein by reference.

FIELD

The embodiments discussed herein are directed to a compound semiconductor device, a method of manufacturing the same and others.

BACKGROUND

Nitride semiconductors such as GaN, AlN, InN, a mixed crystal thereof have characteristics such as a high saturation electron velocity and a wide band gap. Accordingly, various studies have been made on application of the nitride semiconductors to high-output and high-efficiency amplifiers and high-frequency devices and so on by utilizing these characteristics.

As a semiconductor device using the nitride semiconductor, there are a lot of reports as for a field-effect transistor, particularly as for a high electron mobility transistor (HEMT). For example, operations at a shallow threshold voltage are demanded for the HEMT. It is effective to make an insulating film between a gate electrode and a channel thin to enable the operations at the shallow threshold voltage. However, a gate leakage current may be large, or a withstand voltage may be lowered if the insulating film is made thin. A semiconductor device is proposed where fluorine-ion is contained in a whole of the insulating film to enable normally-off operations, but a sheet resistance is extremely high in this semiconductor device.

Patent Literature 1: Japanese Laid-Open Patent Publication No. 2013-207274
Patent Literature 2: Japanese Laid-Open Patent Publication No. 2010-186943
Patent Literature 3: Japanese Laid-Open Patent Publication No. 2007-294528
Patent Literature 4: Japanese Laid-Open Patent Publication No. 2007-27276
Patent Literature 5: Japanese Laid-Open Patent Publication No. 2008-218696
Patent Literature 6: Japanese National Publication of International Patent Application No. 2009-507396

SUMMARY

According to an aspect of the embodiments, a compound semiconductor device includes: a substrate; a channel layer over the substrate; a carrier supply layer over the channel layer; a gate electrode, a source electrode and a drain electrode above the channel layer and the carrier supply layer; and an insulating film that covers the carrier supply layer between the source electrode and the drain electrode, wherein the insulating film includes: a first region that contains anion under the gate electrode; and a second region on the source electrode side or on the drain electrode side of the first region, an anion concentration in the second region being lower than an anion concentration in the first region.

According to another aspect of the embodiments, a method of manufacturing a compound semiconductor device includes: forming a channel layer over a substrate; forming a carrier supply layer over the channel layer; forming a gate electrode, a source electrode and a drain electrode above the channel layer and the carrier supply layer; forming an insulating film that covers the carrier supply layer between the source electrode and the drain electrode; and implanting anion selectively into the insulating film so that the insulating film includes a first region that contains anion under the gate electrode, and a second region on the source electrode side or on the drain electrode side of the first region, an anion concentration in the second region being lower than an anion concentration in the first region.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6A to FIG. 6F are sectional views illustrating a method of manufacturing the compound semiconductor device according to the third embodiment in process sequence;

DESCRIPTION OF EMBODIMENTS

Hereinafter, embodiments will be concretely described with reference to the attached drawings.

First Embodiment

Figure 1:
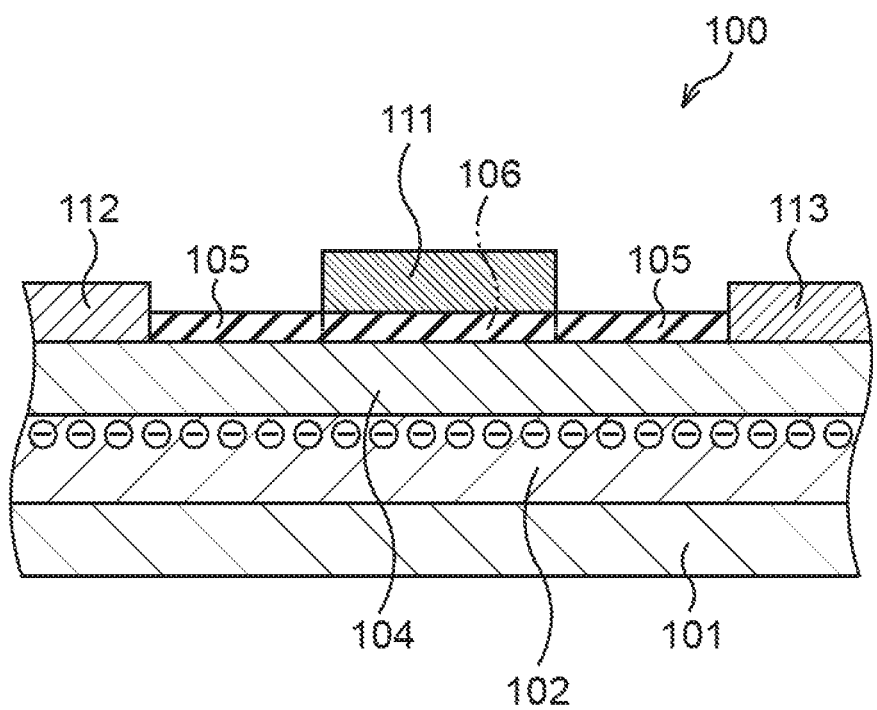
FIG. 1 is a sectional view illustrating a structure of a compound semiconductor device according to a first embodiment.

First, a first embodiment is described. The first embodiment relates to an example of a high electron mobility transistor (HEMT). FIG. 1 is a sectional view illustrating a structure of a compound semiconductor device according to the first embodiment.

As illustrated in FIG. 1, a substrate 101, a channel layer 102 over the substrate 101, and a carrier supply layer 104 over the channel layer 102 are included in a compound semiconductor device 100 according to the first embodiment. A gate electrode 111, a source electrode 112 and a drain electrode 113 above the channel layer 102 and the carrier supply layer 104, and an insulating film 105 that covers the carrier supply layer 104 between the source electrode 112 and the drain electrode 113 are also included in the compound semiconductor device 100. An anion-containing region 106 that contains anion under the gate electrode 111, and a region on the source electrode 112 side or the drain electrode 113 side of the anion-containing region 106 are included in the insulating film 105. An anion concentration in the region is lower than an anion concentration in the anion-containing region 106. In the present embodiment, the anion-containing region 106 is an example of a first region, and the remaining part of the insulating film 105 is an example of a second region.

Two-dimensional electron gas (2DEG) exists in a vicinity of an upper surface of the channel layer 102 in the present embodiment. The anion contained in the insulting film 105 has an effect making a threshold voltage of the HEMT shallow. In the present embodiment, the anion-containing region 106 is disposed under the gate electrode 111, and therefore, the threshold voltage is shallower compared to a structure in which the anion is not contained in a whole of the insulating film 105. It is therefore possible to obtain the shallow threshold voltage while using the insulating film 105 with a thickness enough to reduce a gate leakage current and to secure a withstand voltage.

Defects inevitably exist in the insulating film 105 and on an interface with the carrier supply layer 104 of the insulating film 105. In general, the defects may incur variation of the threshold voltage. Though details are described later, the anion contained in the insulating film 105 also has an effect suppressing variation of the threshold voltage. Accordingly, in the present embodiment, it is possible to suppress the variation of the threshold voltage due to the above-stated defects.

As stated above, according to the present embodiment, it is possible to adjust the threshold voltage and to suppress the variation of the threshold voltage while avoiding increase in the gate leakage current.

Besides, the region is disposed in the insulating film 105 where the anion concentration therein is lower than the anion concentration in the anion-containing region 106, and therefore, excessive decrease in 2DEG due to the contained anion is suppressed, and increase in a sheet resistance can be suppressed. The anion-containing region 106 may protrude from the gate electrode 111 in planar view, but is preferably formed only at a part of the insulating film 105 overlapping the gate electrode 111 in planar view. It is to suppress the increase in the sheet resistance more effectively.

Next, a method of manufacturing the compound semiconductor device according to the first embodiment is described. FIG. 2A to FIG. 2F are sectional views illustrating the method of manufacturing the compound semiconductor device according to the first embodiment in process sequence.

Figure 2A:
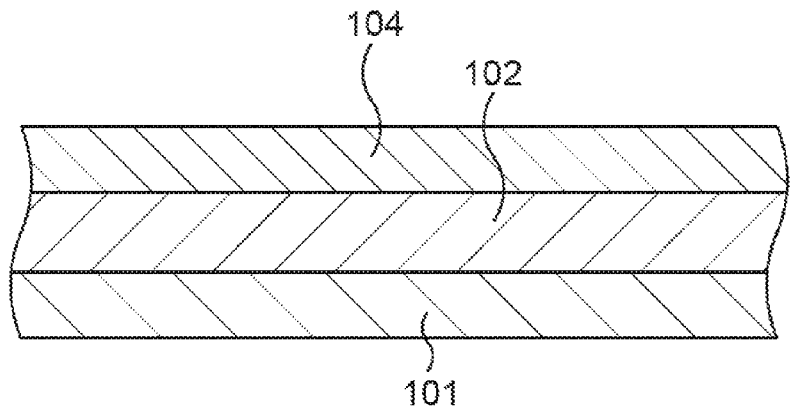
FIG. 2A to FIG. 2F are sectional views illustrating a method of manufacturing the compound semiconductor device according to the first embodiment in process sequence.
Figure 2B:
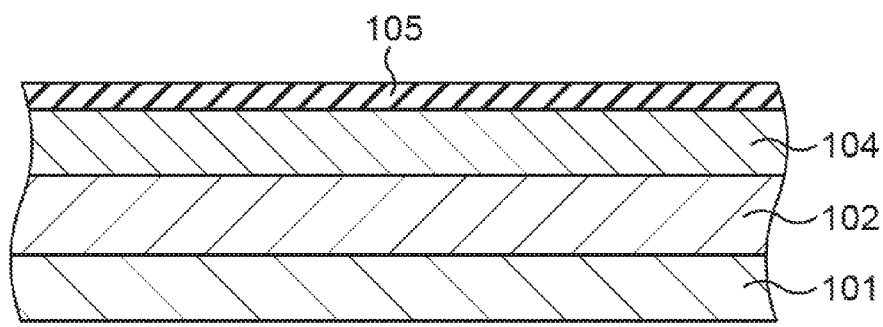
Figure 2C:
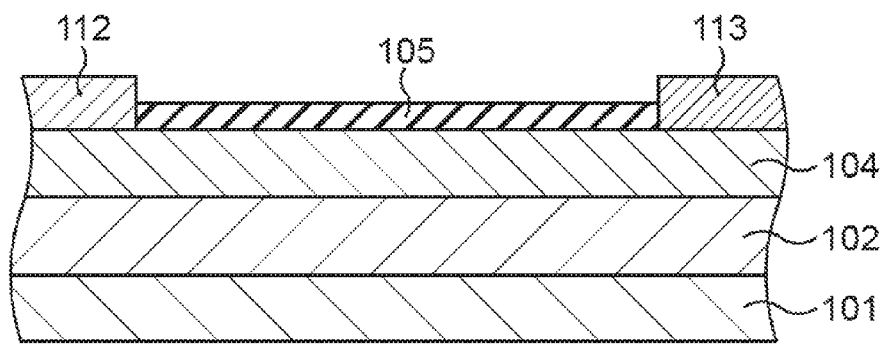
Figure 2D:
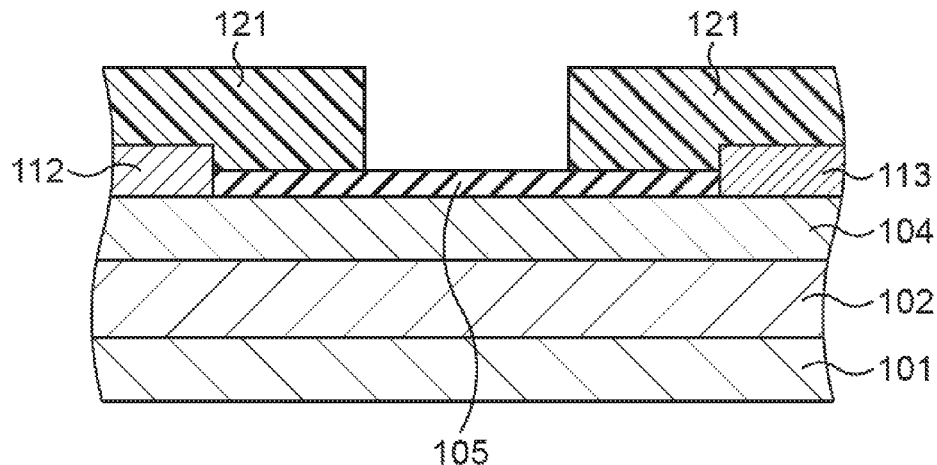
Figure 2E:
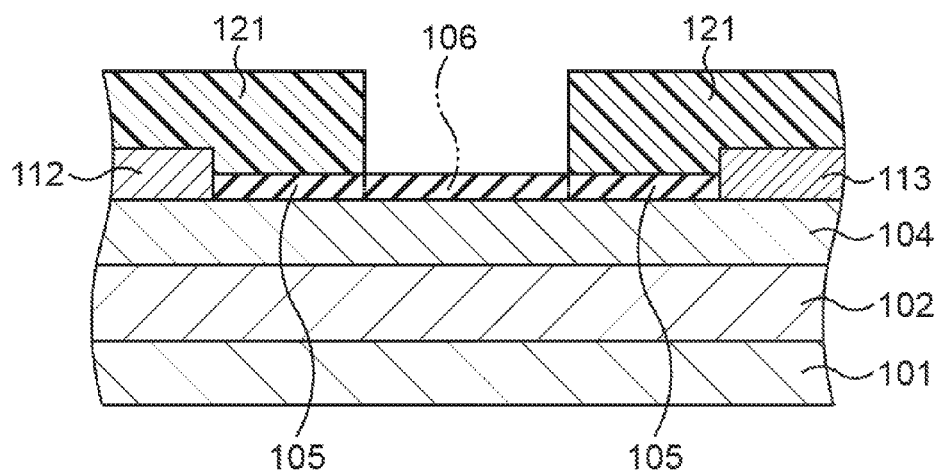
Figure 2F:
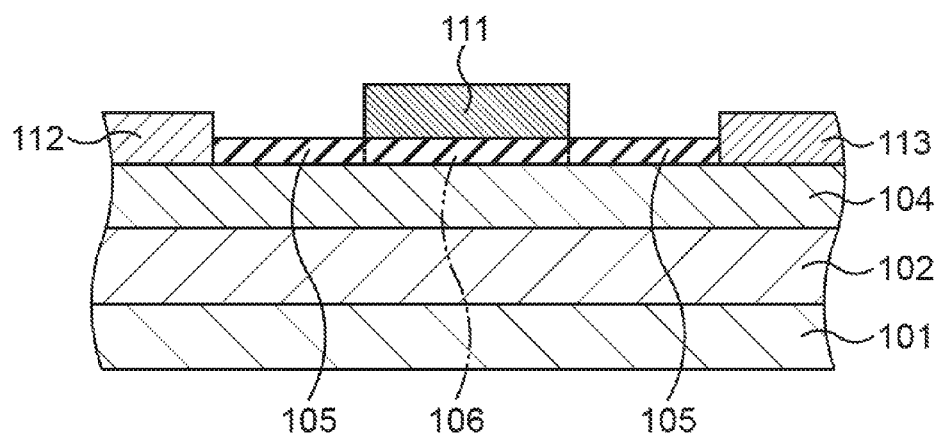

First, as illustrated in FIG. 2A, the channel layer 102 and the carrier supply layer 104 are formed over the substrate 101. Then, as illustrated in FIG. 2B, the insulating film 105 is formed over the carrier supply layer 104. Then, a heat treatment is performed to remove hydrogen ion remaining in the insulating film 105 and on the interface. As a result, the threshold voltage shifts toward a plus side and the threshold voltage becomes shallow. Thereafter, as illustrated in FIG. 2C, two openings are formed in the insulating film 105, and the source electrode 112 is formed in one of the openings, and the drain electrode 113 is formed in the other one of the openings. Then, a heat treatment is performed so that the source electrode 112 and the drain electrode 113 are brought into ohmic-contact with 2DEG. Then, as illustrated in FIG. 2D, a mask 121 exposing a region where the anion-containing region 106 is to be formed and covering the remaining part of the insulating film 105 is formed on the insulating film 105, the source electrode 112, and the drain electrode 113. Thereafter, as illustrated in FIG. 2E, ion-implantation of anion is performed to form the anion-containing region 106 in a part of the insulating film 105. Subsequently, as illustrated in FIG. 2F, the gate electrode 111 is formed on the insulating film 105 so as to overlap at least a part of the anion-containing region 106 in planar view.

Then, a protective film, a wiring, and others are formed according to need to complete the compound semiconductor device.

According to this method, the heat treatment of the insulating film 105 and the heat treatment to obtain the ohmic-contact are finished before the anion-containing region 106 is formed. It is therefore not necessary to perform a heat treatment which causes removal of the anion from the anion-containing region 106 after the anion-containing region 106 is formed. If a heat treatment of the insulating film 105 is performed after the anion-containing region 106 is formed, the anion may be removed from the anion-containing region 106 during the heat treatment. Even if an insulating film containing anion is formed, and thereafter, a heat treatment is performed, instead of forming the anion-containing region 106 by implanting the anion into the insulating film 105, the anion may be removed during the heat treatment. If the heat treatment to obtain the ohmic-contact is performed after the anion-containing region 106 is formed, the anion may be removed from the anion-containing region 106 during the heat treatment.

Second Embodiment

Figure 3:
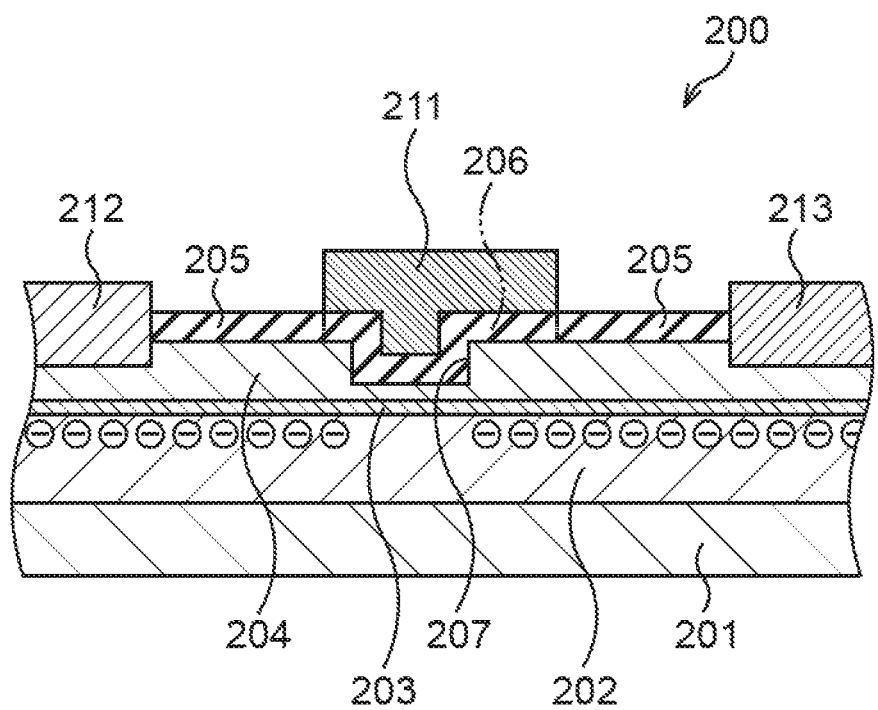
FIG. 3 is a sectional view illustrating a structure of a compound semiconductor device according to a second embodiment.

Next, a second embodiment is described. The second embodiment relates to an example of a high electron mobility transistor (HEMT). FIG. 3 is a sectional view illustrating a structure of a compound semiconductor device according to the second embodiment.

As illustrated in FIG. 3, a substrate 201, a channel layer 202 over the substrate 201, a spacer layer 203 over the channel layer 202, and a carrier supply layer 204 over the spacer layer 203 are included in a compound semiconductor device 200 according to the second embodiment. A gate electrode 211, a source electrode 212 and a drain electrode 213 above the channel layer 202 and the carrier supply layer 204, and an insulating film 205 that covers the carrier supply layer 204 between the source electrode 212 and the drain electrode 213 are also included in the compound semiconductor device 200. A recess 207 is formed at a surface of the carrier supply layer 204 between the source electrode 212 and the drain electrode 213, and the gate electrode 211 is formed to straddle the recess 207. Namely, a part overlapping the recess 207 and a part outside the recess 207 in planar view (overhanging part) are included in the gate electrode 211. An anion-containing region 206 that contains anion under the gate electrode 211, and a region on the source electrode 212 side or the drain electrode 213 side of the anion-containing region 206 are included in the insulating film 205. An anion concentration in the region is lower than an anion concentration in the anion-containing region 206. In the present embodiment, the anion-containing region 206 is an example of a first region, and the remaining part of the insulating film 205 is an example of a second region.

The substrate 201 is a SiC substrate, a Si substrate, a sapphire substrate, or a GaN substrate, for example. The channel layer 202 is an undoped GaN layer, which is an i-type GaN layer, with a thickness of approximately 3 μm, for example. The spacer layer 203 is an undoped AlGaN layer, which is an i-type AlGaN layer, with a thickness of approximately 5 nm, for example. The carrier supply layer 204 is an AlGaN layer doped with a donor impurity, which is an n-type AlGaN layer, with a thickness of approximately 30 nm, for example. For example, the carrier supply layer 204 is doped with Si at a concentration of approximately $5 \times 10^{18}$ cm$^{-3}$ as the donor impurity. The gate electrode 211 includes a Ni film with a thickness of approximately 30 nm and a Au film with a thickness of approximately 400 nm thereon, for example, and the source electrode 212 and the drain electrode 213 each include a Ti film with a thickness of approximately 20 nm and an Al film with a thickness of approximately 200 nm thereon, for example. The insulating film 205 is an SiO$_2$ film, an Si$_3$N$_4$ film, an SiON film or an Al$_2$O$_3$ film, or a stack of any combination thereof with a thickness of approximately 2 nm to approximately 100 nm, for example. The thickness of the insulating film 205 is, for example, 40 nm. For example, fluorine ion is contained in the anion-containing region 206 at a concentration of approximately $1 \times 10^{18}$ cm$^{-3}$ to approximately $1 \times 10^{21}$ cm$^{-3}$. A concentration of the fluorine ion is $1 \times 10^{19}$ cm$^{-3}$, for example.

2DEG exists in a vicinity of an upper surface of the channel layer 202 in the present embodiment. The anion contained in the insulating film 205 has an effect making a threshold voltage of the HEMT shallow. In the present embodiment, the anion-containing region 206 is disposed under the gate electrode 211, and therefore, the threshold voltage is shallower compared to a structure in which the anion is not contained in a whole of the insulating film 205. It is therefore possible to obtain the shallow threshold voltage while using the insulating film 205 with a thickness enough to reduce a gate leakage current and to secure a withstand voltage.

Though defects inevitably exist in the insulating film 205 and on an interface with the carrier supply layer 204 of the insulating film 205, the anion contained in the insulating film 205 also has an effect suppressing variation of the threshold voltage. Accordingly, in the present embodiment, it is possible to suppress the variation of the threshold voltage due to the above-stated defects.

As stated above, according to the present embodiment, it is possible to adjust the threshold voltage and to suppress the variation of the threshold voltage while avoiding increase in the gate leakage current.

Besides, the region is disposed in the insulating film 205 where the anion concentration therein is lower than the anion concentration in the anion-containing region 206, and therefore, excessive decrease in 2DEG due to the contained anion is suppressed, and increase in a sheet resistance can be suppressed. The anion-containing region 206 may protrude from the gate electrode 211 in planar view, but is preferably formed only at a part of the insulating film 205 overlapping the gate electrode 211 in planar view. It is to suppress the increase in the sheet resistance more effectively.

Next, a method of manufacturing the compound semiconductor device according to the second embodiment is described. FIG. 4A to FIG. 4F are sectional views illustrating the method of manufacturing the compound semiconductor device according to the second embodiment in process sequence.

Figure 4A:
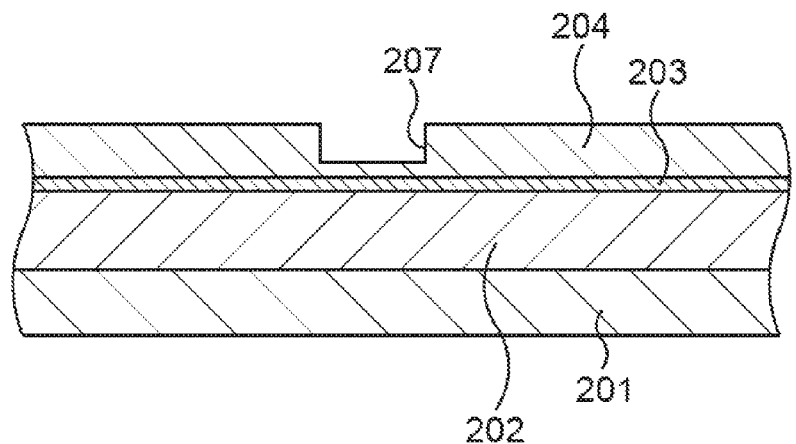
FIG. 4A to FIG. 4F are sectional views illustrating a method of manufacturing the compound semiconductor device according to the second embodiment in process sequence.

First, as illustrated in FIG. 4A, the channel layer 202, the spacer layer 203 and the carrier supply layer 204 are formed over the substrate 201. The channel layer 202, the spacer layer 203 and the carrier supply layer 204 may be formed by a crystal growth method such as a metal organic vapor phase epitaxy (MOVPE) method or a molecular beam epitaxy (MBE) method, for example. For example, mixed gas of trimethylaluminum (TMA) gas, trimethylgallium (TMG) gas and ammonia (NH$_3$) gas is used as source gas. Depending on a compound semiconductor layer to be formed, presence/absence of supply of the TMA gas and the TMG gas and flow rates thereof are selected appropriately. Silane (SiH$_4$) may be used as a material of silicon (Si) contained in the carrier supply layer 204, for example. Then, an element isolation region which defines an element region is formed in a stack of the channel layer 202, the spacer layer 203 and the carrier supply layer 204. When the element isolation region is formed, for example, a pattern of a photoresist exposing a region where the element isolation region is to be formed is formed on the carrier supply layer 204, and dry etching using chlorine-based gas is performed while using this pattern as an etching mask. Ion implantation of Ar or the like may be performed while using this pattern as a mask. Thereafter, the recess 207 is formed at a part of the surface of the carrier supply layer 204 in the element region. When the recess 207 is formed, for example, a pattern of the photoresist exposing a region where the recess 207 is to be formed is formed on the carrier supply layer 204, and dry etching using the chlorine-based gas is performed while using this pattern as an etching mask.

Figure 4B:
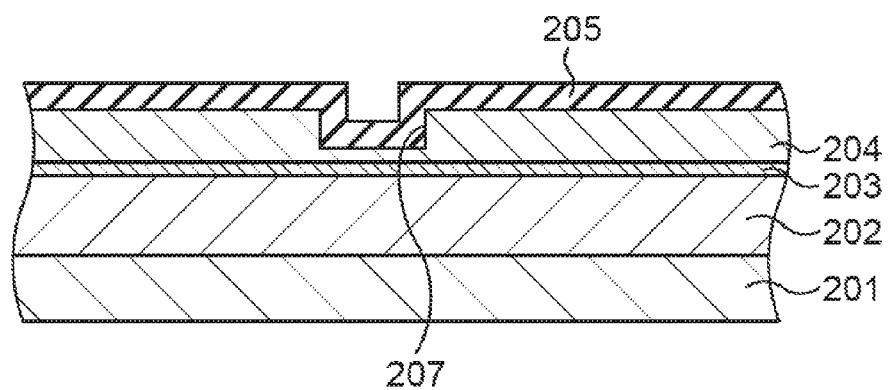

Subsequently, as illustrated in FIG. 4B, the insulating film 205 is formed over the carrier supply layer 204. Then, a heat treatment is performed to remove hydrogen ion remained in the insulating film 205 and on the interface. As a result, the threshold voltage shifts toward a plus side and the threshold voltage becomes shallow. The insulating film 205 may be formed by a plasma chemical vapor deposition (CVD) method or an atomic layer deposition (ALD) method, for example. This heat treatment is performed in a nitrogen atmosphere at approximately 400° C. to approximately 1000° C., for example. This temperature is approximately 800° C., for example. It is preferable to perform a process exposing the surface of the carrier supply layer 204 to N$_2$ or NH$_3$ plasma before the insulating film 205 is formed. Natural oxide existing on the surface of the carrier supply layer 204 is removed by this process, interface defects are reduced because nitrogen vacancies are compensated, and therefore, the variation of the threshold voltage and a current collapse can be suppressed.

Figure 4C:
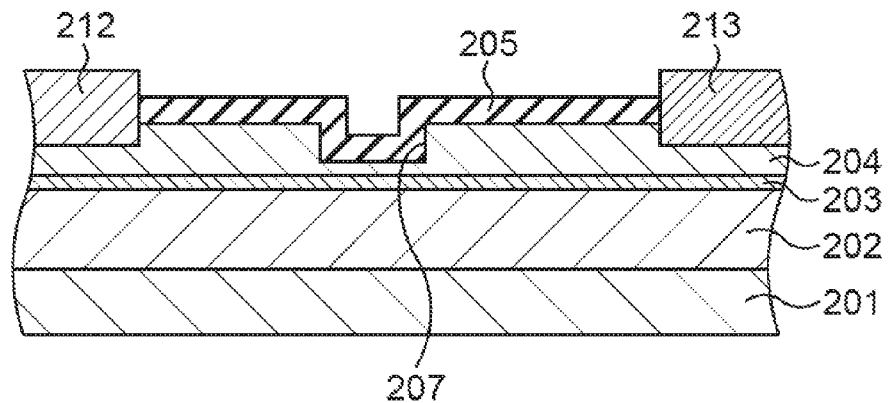

Then, a pattern of photoresist exposing a region where the source electrode 212 is to be formed and a region where the drain electrode 213 is to be formed is formed on the insulating film 205. Thereafter, a part of the insulating film 205 is removed by dry etching using fluorine-based gas or wet etching using buffered hydrofluoric acid (BHF), and a part of the carrier supply layer 204 is removed by dry etching using chlorine-based gas while using this pattern as an etching mask. Openings are thereby formed at two positions. Subsequently, as illustrated in FIG. 4C, the source electrode 212 is formed in one of the openings, and the drain electrode 213 is formed in the other one of the openings. The source electrode 212 and the drain electrode 213 may be formed by a lift-off method, for example. Namely, a metal film is formed by a vapor deposition method while using the above-stated pattern as a growth mask, and this pattern is removed together with a part of the metal film formed thereon. When the metal film is formed, a Ti film is formed and an Al film is formed thereon, for example. After the source electrode 212 and the drain electrode 213 are formed, the source electrode 212 and the drain electrode 213 are brought into ohmic-contact with 2DEG by a heat treatment in a nitrogen atmosphere, for example. This heat treatment is performed in the nitrogen atmosphere at approximately 400° C. to approximately 1000° C., for example. This temperature is approximately 600° C., for example.

Figure 4D:
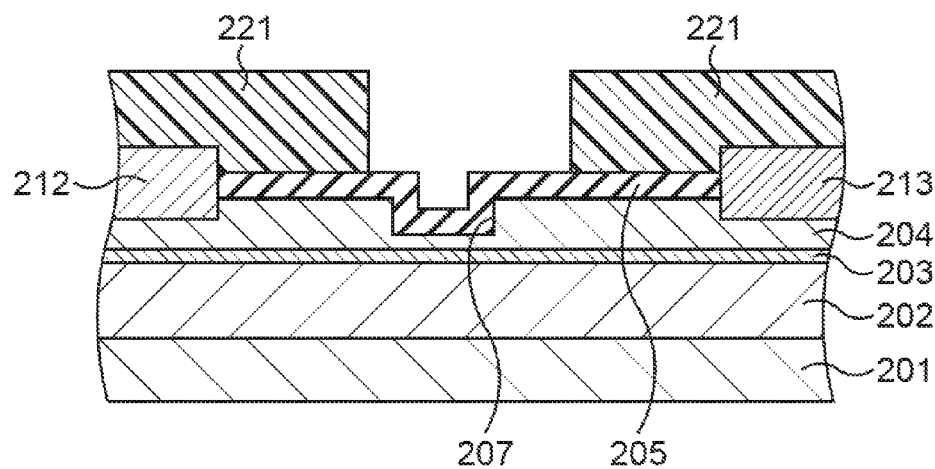

Then, as illustrated in FIG. 4D, a mask 221 exposing a region where the anion-containing region 206 is to be formed and covering the remaining part of the insulating film 205 is formed on the insulating film 205, the source electrode 212 and the drain electrode 213. The mask 221 is a pattern of photoresist, for example.

Figure 4E:
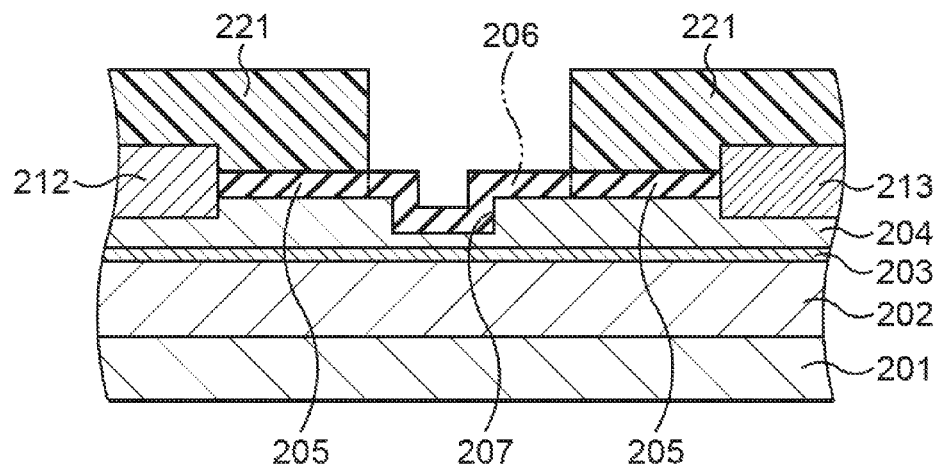

Thereafter, as illustrated in FIG. 4E, ion implantation of anion is performed to form the anion-containing region 206 in a part of the insulating film 205. When the ion implantation of anion is performed, halogen ion such as fluorine ion is implanted with an energy of 10 keV at a concentration of approximately $1 \times 10^{18}$ cm$^{-3}$ to approximately $1 \times 10^{21}$ cm$^{-3}$, for example. The ion implantation is preferably performed from an oblique direction to implant the anion into a part of the insulating film 205 on a side surface of the recess 207.

Figure 4F:
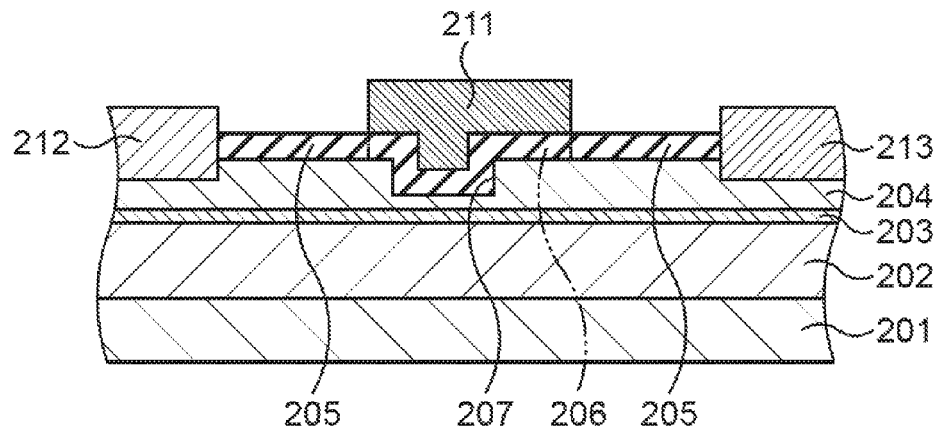

Subsequently, as illustrated in FIG. 4F, the gate electrode 211 is formed on the insulating film 205 so as to overlap the anion-containing region 206 in planar view. The gate electrode 211 may be formed by a lift-off method, for example. Namely, a metal film is formed by a vapor deposition method while using the mask 221 as a growth mask, and the mask 221 is removed together with a part of the metal film formed thereon. When the metal film is formed, a Ni film is formed and a Au film is formed thereon, for example. After the gate electrode 211 is formed, a heat treatment may be performed in nitrogen atmosphere at approximately 150° C. to approximately 450° C., for example. Effects such as enabling low-resistance wiring, reduction in a contact resistance, relaxation of stress are obtained by the heat treatment. The temperature is approximately 300° C., for example.

Then, a protective film, a wiring, and others are formed according to need to complete the compound semiconductor device.

According to this method, the heat treatment of the insulating film 205 and the heat treatment to obtain the ohmic-contact are finished before the anion-containing region 206 is formed. It is therefore not necessary to perform annealing which causes removal of the anion from the anion-containing region 206 after the anion-containing region 206 is formed. If a heat treatment of the insulating film 205 is performed after the anion-containing region 206 is formed, the anion may be removed from the anion-containing region 206 during the heat treatment. Even if an insulating film containing anion is formed, and thereafter, a heat treatment is performed, instead of forming the anion-containing region 206 by implanting the anion into the insulating film 205, the anion may be removed during the heat treatment. If the heat treatment to obtain the ohmic-contact is performed after the anion-containing region 206 is formed, the anion may be removed from the anion-containing region 206 during the heat treatment. The anion is not removed during the heat treatment at approximately 150° C. to approximately 450° C. after the gate electrode 211 is formed.

Third Embodiment

Figure 5:
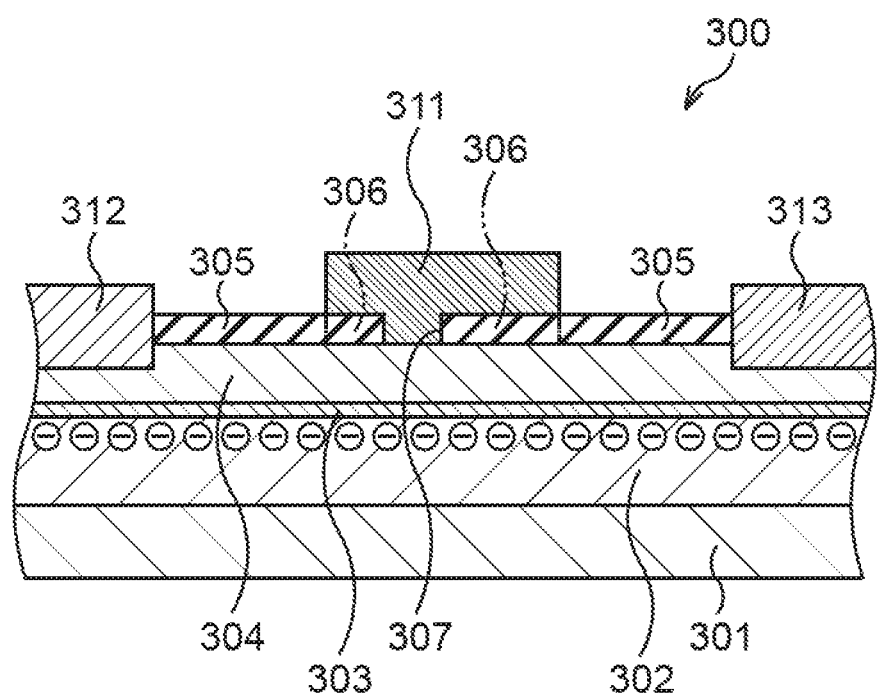
FIG. 5 is a sectional view illustrating a structure of a compound semiconductor device according to a third embodiment.

Next, a third embodiment is described. The third embodiment relates to an example of a high electron mobility transistor (HEMT). FIG. 5 is a sectional view illustrating a structure of a compound semiconductor device according to the third embodiment.

As illustrated in FIG. 5, a substrate 301, a channel layer 302 over the substrate 301, a spacer layer 303 over the channel layer 302, and a carrier supply layer 304 over the spacer layer 303 are included in a compound semiconductor device 300 according to the third embodiment. A gate electrode 311, a source electrode 312 and a drain electrode 313 above the channel layer 302 and the carrier supply layer 304, and an insulating film 305 that covers the carrier supply layer 304 between the source electrode 312 and the drain electrode 313 are also included in the compound semiconductor device 300. An opening 307 is formed in the insulating film 305 between the source electrode 312 and the drain electrode 313, and the gate electrode 311 is in Schottky-contact with the carrier supply layer 304 through the opening 307. Namely, a part overlapping the opening 307 and a part outside the opening 307 in planar view (overhanging part) are included in the gate electrode 311. An anion-containing region 306 that contains anion under the gate electrode 311, and a region on the source electrode 312 side or the drain electrode 313 side of the anion-containing region 306 are included in the insulating film 305. An anion concentration in the region is lower than an anion concentration in the anion-containing region 306. In the present embodiment, the anion-containing region 306 is an example of a first region, and the remaining part of the insulating film 305 is an example of a second region.

Materials and thicknesses of the substrate 301, the channel layer 302, the spacer layer 303 and the carrier supply layer 304 may be the same as the materials and the thicknesses of the substrate 201, the channel layer 202, the spacer layer 203 and the carrier supply layer 204, respectively. Materials and thicknesses of the gate electrode 311, the source electrode 312 and the drain electrode 313 may be the same as the materials and the thicknesses of the gate electrode 211, the source electrode 212 and the drain electrode 213, respectively. Materials and thicknesses of the insulating film 305 and the anion-containing region 306 may be the same as the materials and the thicknesses of the insulating film 205 and the anion-containing region 206, respectively.

2DEG exists in a vicinity of an upper surface of the channel layer 302 in the present embodiment. The anion contained in the insulating film 305 has an effect making a threshold voltage of the HEMT shallow. In the present embodiment, the anion-containing region 306 is disposed under the gate electrode 311, and therefore, the threshold voltage is shallower compared to a structure in which the anion is not contained in a whole of the insulating film 305.

It is therefore possible to obtain the shallow threshold voltage while using the insulating film 305 with a thickness enough to reduce a gate leakage current and to secure a withstand voltage.

Though defects inevitably exist in the insulating film 305 and on an interface with the carrier supply layer 304 of the insulating film 305, the anion contained in the insulating film 305 also has an effect suppressing variation of the threshold voltage. Accordingly, in the present embodiment, it is possible to suppress the variation of the threshold voltage due to the above-stated defects.

As stated above, according to the present embodiment, it is possible to adjust the threshold voltage and to suppress the variation of the threshold voltage while avoiding increase in the gate leakage current.

Besides, the region is disposed in the insulating film 305 whose the anion concentration therein is lower than the anion concentration in the anion-containing region 306, and therefore, excessive decrease in 2DEG due to the contained anion is suppressed, and increase in a sheet resistance can be suppressed. The anion-containing region 306 may protrude from the gate electrode 311 in planar view, but is preferably formed only at a part of the insulating film 305 overlapping the gate electrode 311 in planar view. It is to suppress the increase in the sheet resistance more effectively.

Next, a method of manufacturing the compound semiconductor device according to the third embodiment is described. FIG. 6A to FIG. 6F are sectional views illustrating the method of manufacturing the compound semiconductor device according to the third embodiment in process sequence.

Figure 6A:
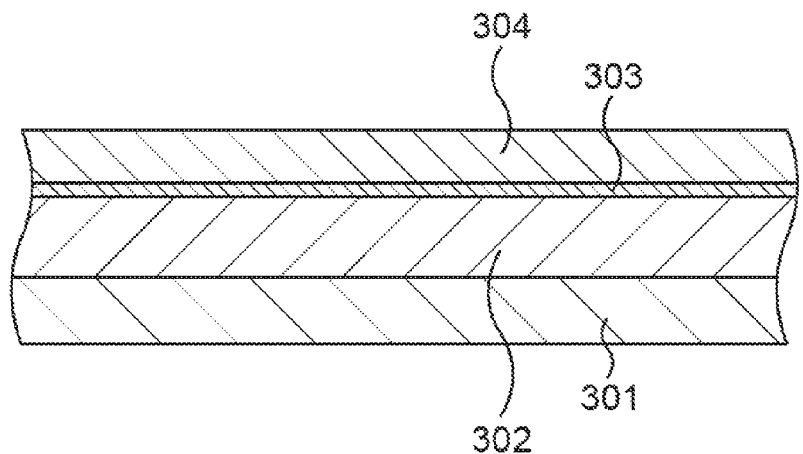

First, as illustrated in FIG. 6A, the channel layer 302, the spacer layer 303 and the carrier supply layer 304 are formed over the substrate 301. Then, an element isolation region which defines an element region is formed in a stack of the channel layer 302, the spacer layer 303 and the carrier supply layer 304.

Figure 6B:
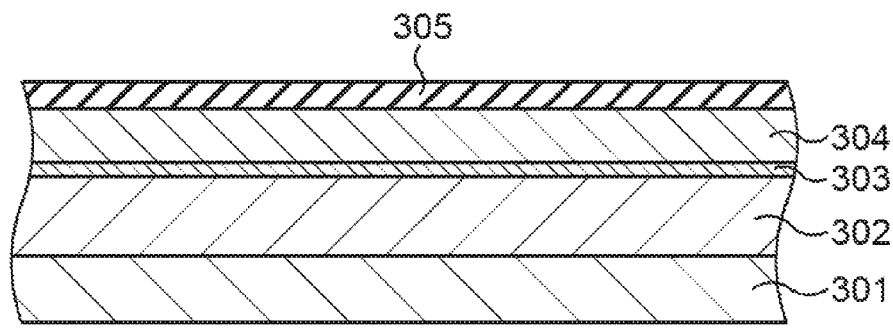

Thereafter, as illustrated in FIG. 6B, the insulating film 305 is formed over the carrier supply layer 304. Then, a heat treatment is performed to remove hydrogen ion remained in the insulating film 305 and on the interface. As a result, the threshold voltage shifts toward a plus side and the threshold voltage becomes shallow. It is preferable to perform a process exposing the surface of the carrier supply layer 304 to $N_2$ or $NH_3$ plasma before the insulating film 305 is formed. Natural oxide existing on the surface of the carrier supply layer 304 is removed by this process, interface defects are reduced because nitrogen vacancies are compensated, and therefore, the variation of the threshold voltage and a current collapse can be suppressed.

Figure 6C:
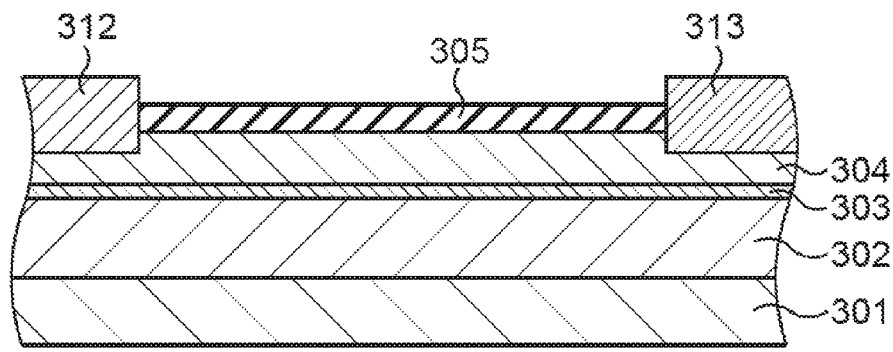

Subsequently, a pattern of photoresist exposing a region where the source electrode 312 is to be formed and a region where the drain electrode 313 is to be formed is formed on the insulating film 305. Then, a part of the insulating film 305 is removed by dry etching using fluorine-based gas or wet etching using buffered hydrofluoric acid (BHF), and a part of the carrier supply layer 304 is removed by dry etching using chlorine-based gas while using this pattern as an etching mask. Openings are thereby formed at two positions. Thereafter, as illustrated in FIG. 6C, the source electrode 312 is formed in one of the openings, and the drain electrode 313 is formed in the other one of the openings. After the source electrode 312 and the drain electrode 313 are formed, the source electrode 312 and the drain electrode 313 are brought into ohmic-contact with 2DEG by a heat treatment in a nitrogen atmosphere, for example. This heat treatment is performed in the nitrogen atmosphere at approximately 400° C. to approximately 1000° C., for example. This temperature is approximately 600° C., for example.

Subsequently, as illustrated in FIG. 6D, a mask 321 exposing a region where the anion-containing region 306 is to be formed, and covering the remaining part of the insulating film 305 is formed on the insulating film 305, the source electrode 312 and the drain electrode 313. The mask 321 is a pattern of photoresist, for example.

Then, as illustrated in FIG. 6E, ion implantation of anion is performed to form the anion-containing region 306 in a part of the insulating film 305. When the ion implantation of anion is performed, halogen ion such as fluorine ion is implanted with an energy of 10 keV at a concentration of approximately $1\times10^{18}$ cm$^{-3}$ to approximately $1\times10^{21}$ cm$^{-3}$, for example.

Thereafter, as illustrated in FIG. 6F, the opening 307 is formed in the anion-containing region 306. When the opening 307 is formed, a pattern of photoresist exposing a region where the opening 307 is to be formed is formed on the insulating film 305, the source electrode 312 and the drain electrode 313, and dry etching using fluorine-based gas or wet etching using buffered hydrofluoric acid (BHF) is performed while using this pattern as an etching mask. After the opening 307 is formed, the gate electrode 311 is formed on the insulating film 305 so as to overlap the anion-containing region 306 in planar view. The gate electrode 311 may be formed by a lift-off method, for example. Namely, a pattern of photoresist exposing a region where the gate electrode 311 is to be formed and covering the remaining part is formed, a metal film is formed by a vapor deposition method while using this pattern as a growth mask, and this pattern is removed together with a part of the metal film formed thereon. After the gate electrode 311 is formed, a heat treatment may be performed in nitrogen atmosphere at approximately 150° C. to approximately 450° C., for example. Effects such as enabling low-resistance wiring, reduction in a contact resistance, relaxation of stress are obtained by the heat treatment. The temperature is approximately 300° C., for example.

Then, a protective film, a wiring, and others are formed according to need to complete the compound semiconductor device.

According to this method, the heat treatment of the insulating film 305 and the heat treatment to obtain the ohmic-contact are finished before the anion-containing region 306 is formed. It is therefore not necessary to perform annealing which causes removal of the anion from the anion-containing region 306 after the anion-containing region 306 is formed. If a heat treatment of the insulating film 305 is performed after the anion-containing region 306 is formed, the anion may be removed from the anion-containing region 306 during the heat treatment. Even if an insulating film containing anion is formed, and thereafter, a heat treatment is performed, instead of forming the anion-containing region 306 by implanting the anion into the insulating film 305, the anion may be removed during the heat treatment. If the heat treatment to obtain the ohmic-contact is performed after the anion-containing region 306 is formed, the anion may be removed from the anion-containing region 306 during the heat treatment. The anion is not removed during the heat treatment at approximately 150° C. to approximately 450° C. after the gate electrode 311 is formed.

Next, modified examples of the second embodiment are described. FIG. 7A to FIG. 7D are sectional views illustrating the modified examples of the second embodiment.

Figure 7A:
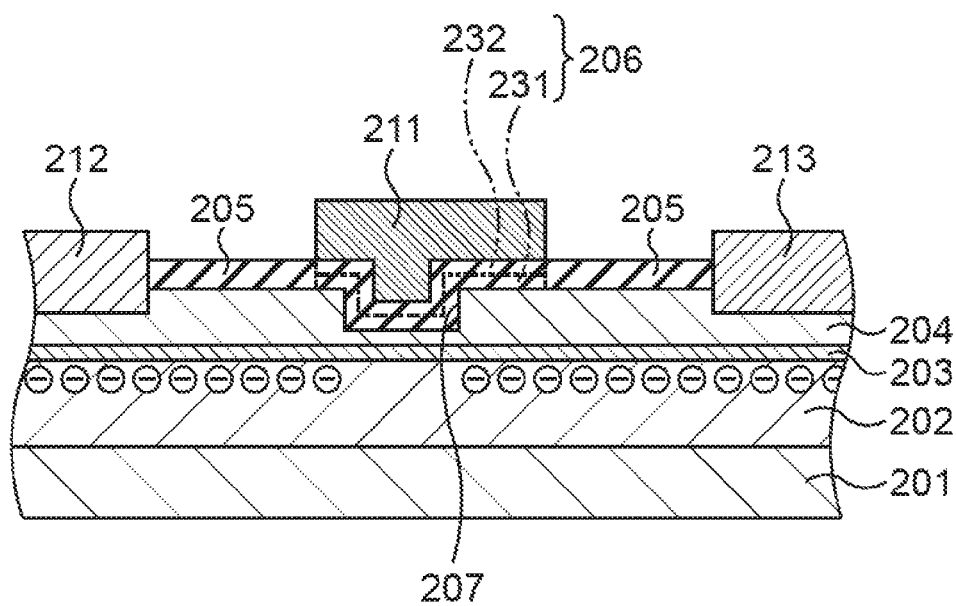
FIG. 7A to FIG. 7D are sectional views each illustrating modified examples of the second embodiment.

In a first modified example illustrated in FIG. 7A, the anion-containing region 206 includes a layer 231 whose fluorine ion concentration is a first value and a layer 232 whose fluorine ion concentration is a second value which is different from the first value. Either of the first value or the second value may be larger. The anion-containing region 206 as stated above may be formed by adjusting the energy and the concentration in the ion-implantation, for example. The fluorine ion concentration may continuously change in the anion-containing region 206 instead of discontinuously changing as the first modified example.

Figure 7B:
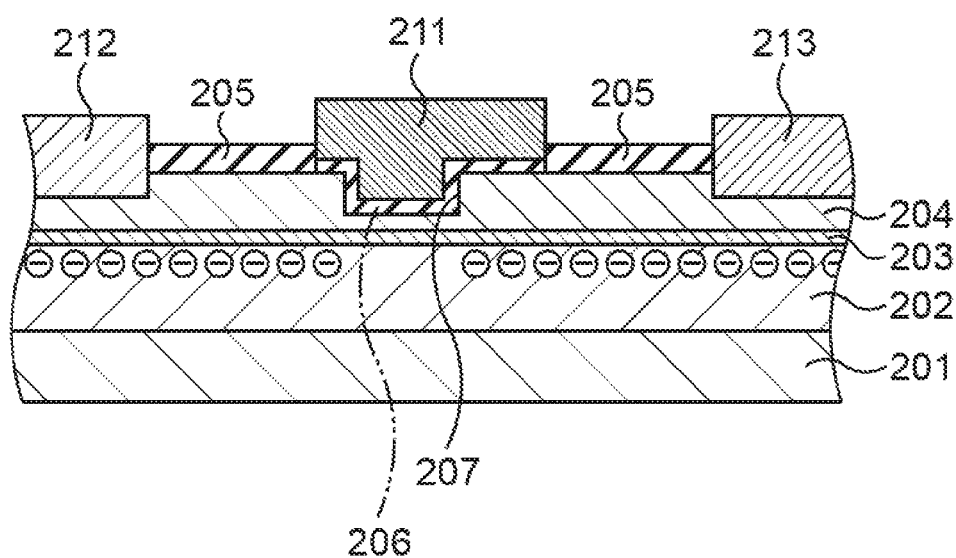

In a second modified example illustrated in FIG. 7B, the anion-containing region 206 is thinner than the remaining part of the insulating film 205. The anion-containing region 206 as stated above may be formed by etching the anion-containing region 206 after the implantation of anion and before the formation of the gate electrode 211, for example.

Figure 7C:
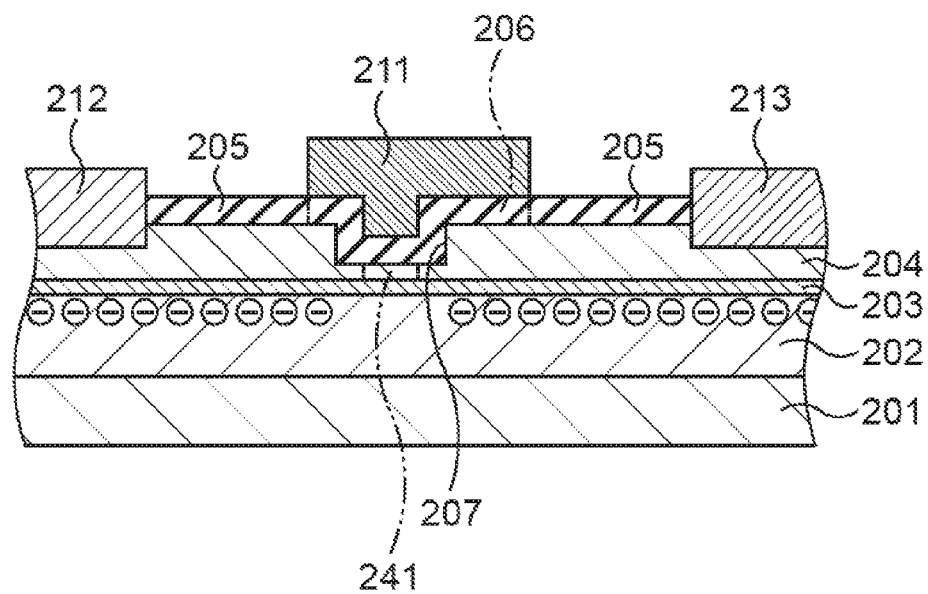

In a third modified example illustrated in FIG. 7C, an anion-containing region 241 is formed in the carrier supply layer 204 at a part under the recess 207. The anion-containing region 241 is preferably formed after the heat treatment to obtain the ohmic-contact of the source electrode 212 and the drain electrode 213 with 2DEG and before the formation of the gate electrode 211, for example.

Figure 7D:
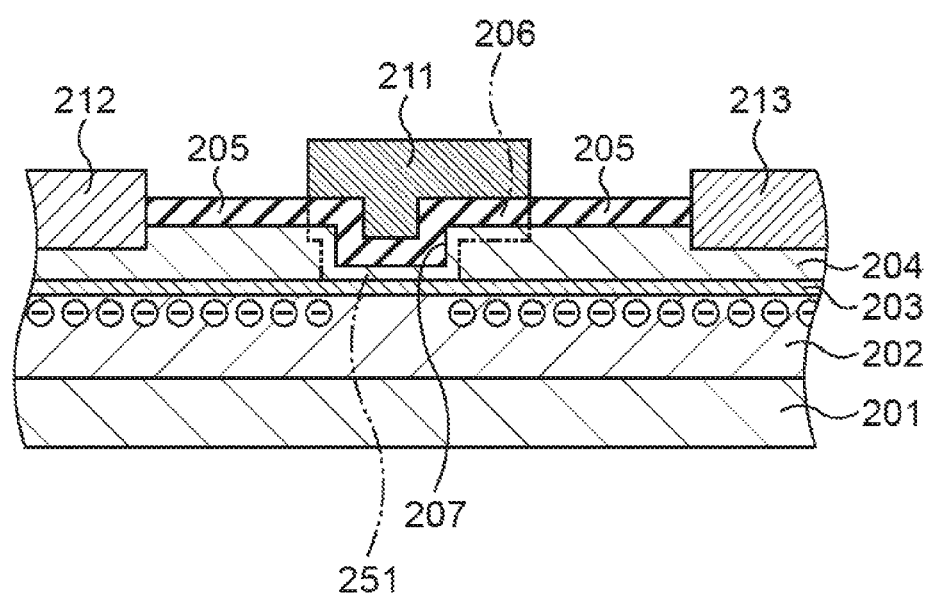

In a fourth modified example illustrated in FIG. 7D, an anion-containing region 251 is formed in the carrier supply layer 204 at a part under the anion-containing region 206. The anion-containing region 251 may be formed by performing implantation of anion using the mask 221 before or after the formation of the anion-containing region 206, for example.

Next, modified examples of the third embodiment are described. FIG. 8A to FIG. 8D are sectional views illustrating the modified examples of the third embodiment.

Figure 8A:
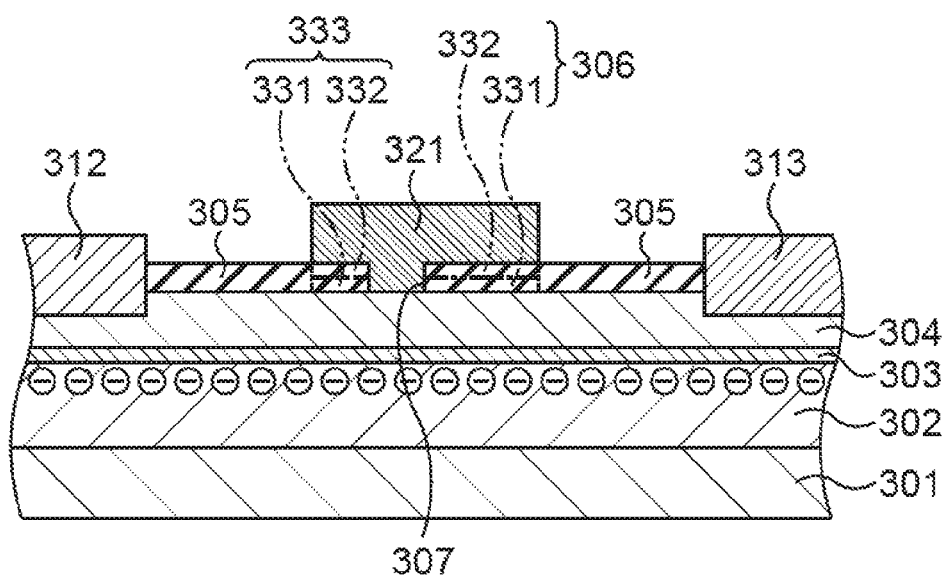
FIG. 8A to FIG. 8D are sectional views each illustrating modified examples of the third embodiment.

In a first modified example illustrated in FIG. 8A, the anion-containing region 306 includes a layer 331 whose fluorine ion concentration is a first value and a layer 332 whose fluorine ion concentration is a second value which is different from the first value. Either of the first value or the second value may be larger. The anion-containing region 306 as stated above may be formed by adjusting the energy and the concentration in the ion-implantation, for example.

Figure 8B:
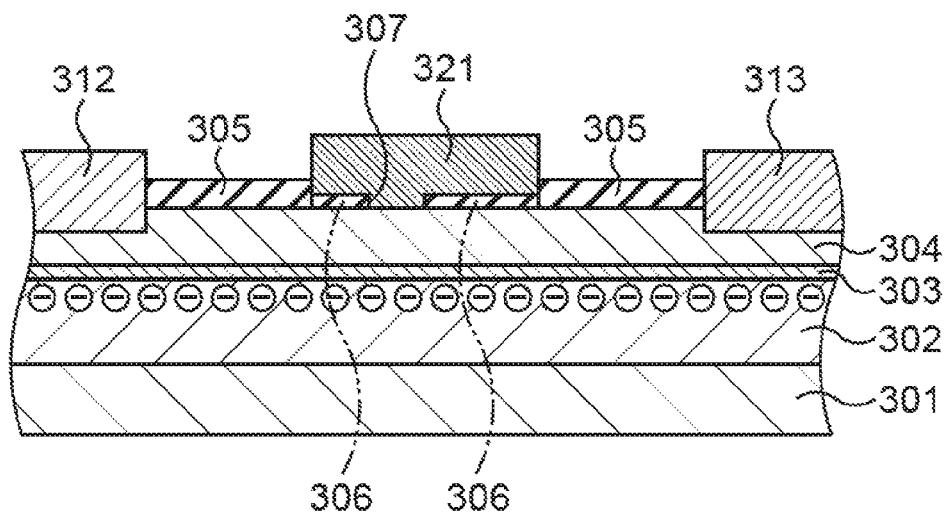

In a second modified example illustrated in FIG. 8B, the anion-containing region 306 is thinner than the remaining part of the insulating film 305. The anion-containing region 306 as stated above may be formed by etching the anion-containing region 306 after the implantation of anion and before the formation of the gate electrode 311, for example.

Figure 8C:
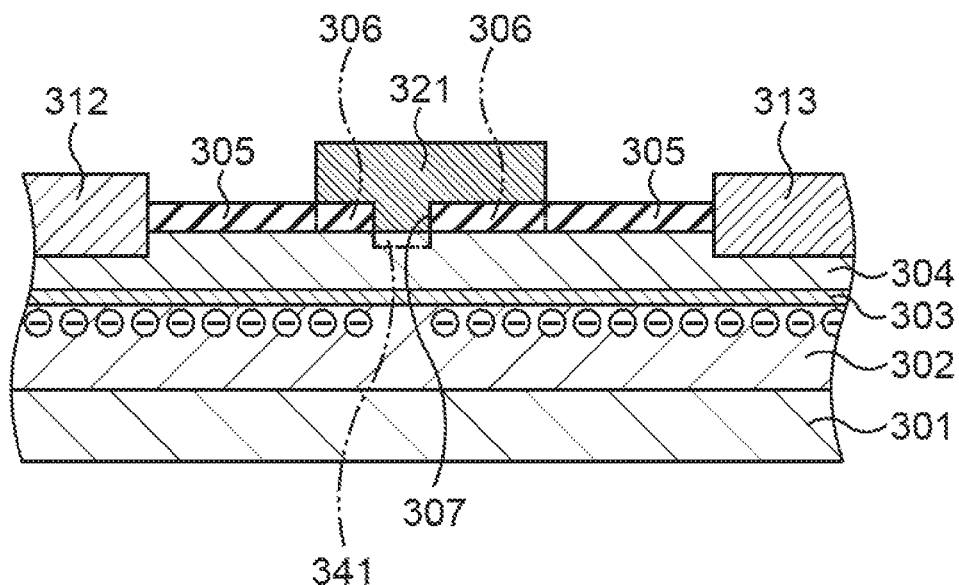

In a third modified example illustrated in FIG. 8C, an anion-containing region 341 is formed in the carrier supply layer 304 at a part under the opening 307. The anion-containing region 341 is preferably formed after the heat treatment to obtain the ohmic-contact of the source electrode 312 and the drain electrode 313 with 2DEG and before the formation of the gate electrode 311, for example.

Figure 8D:
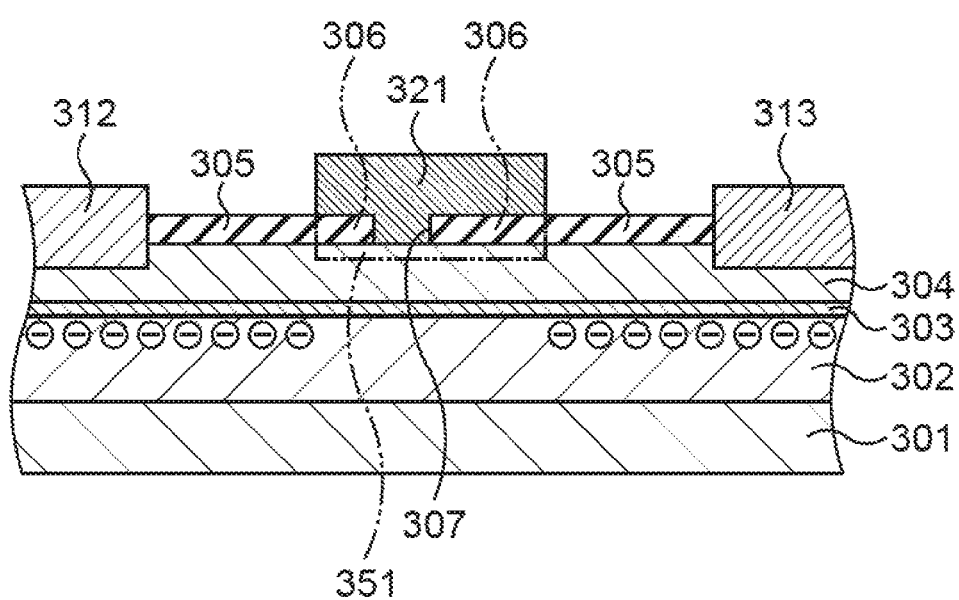

In a fourth modified example illustrated in FIG. 8D, an anion-containing region 351 is formed in the carrier supply layer 304 at a part under the anion-containing region 306. The anion-containing region 351 may be formed by performing implantation of anion using the mask 321 before or after the formation of the anion-containing region 306, for example.

According to these various modified examples, it is possible to more precisely adjust the threshold voltage.

A gate recess may be formed at the surface of the carrier supply layer 304 in the third embodiment or the modified examples thereof. The materials of the insulating film 105, 205 or 305 are not limited to $SiO_2$, $Si_3N_4$, SiON or $Al_2O_3$. The halogen ion contained in the insulating film 105, 205 or 305 may be chlorine ion, bromide ion, iodine ion or astatine ion. Anion other than halogen ion may be contained in the insulating film 105, 205 or 305.

Structures of the gate electrode, the source electrode and the drain electrode are not limited to ones according to the above-stated embodiments. For example, they may be each made up of a single layer. Besides, the formation method of these is not limited to the lift-off method.

The SiC substrate, the sapphire substrate, the silicon substrate, the GaN substrate, a GaAs substrate, and the like may be used as the substrate. The substrate may be any of a conductive, semi-insulating, or insulating one. A thickness, a material, and so on of each layer are also not limited to ones according to the above-stated embodiments.

Next, experiments conducted by the present inventors are described.

First Experiment

In a first experiment, a reference sample R and four kinds of samples S1 to S4 were prepared. When the reference sample R was prepared, a channel layer, a spacer layer and a carrier supply layer were formed over a substrate by MOVPE method. Then, an insulating film was formed over the carrier supply layer, and a gate electrode was formed as same as the first embodiment. When the sample S1 was prepared, a process exposing a surface of the carrier supply layer to $NH_3$ plasma was performed before the insulating film was formed. The other processes were the same as the preparation of the reference sample R. When the sample S2 was prepared, a heat treatment of the insulating film was performed at 700° C. or more after the insulating film was formed. The other processes were the same as the preparation of the reference sample R. When the sample S3 was prepared, a process exposing a surface of the carrier supply layer to $NH_3$ plasma was performed before the insulating film was formed, and the heat treatment of the insulating film was performed at 700° C. or more after the insulating film was formed. The other processes were the same as the preparation of the reference sample R. When the sample S4 was prepared, the heat treatment of the insulating film was performed at 700° C. or more after the insulating film was formed, and fluorine ion was implanted into the insulating film at a concentration of $1\times10^{19}$ $cm^{-3}$ before the gate electrode was formed. The other processes were the same as the preparation of the reference sample R.

Figure 9A:
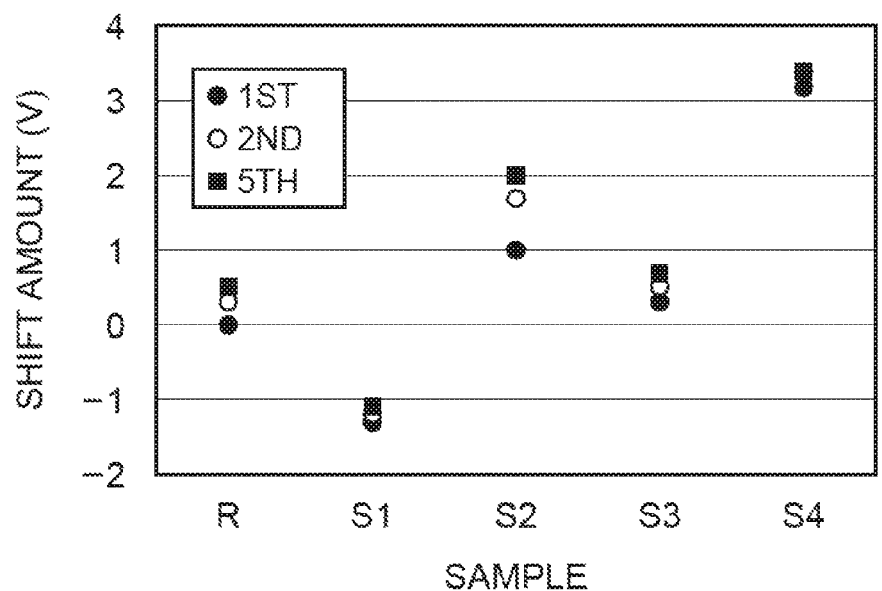
FIG. 9A and FIG. 9B are drawings each illustrating results of a first experiment.
Figure 9B:
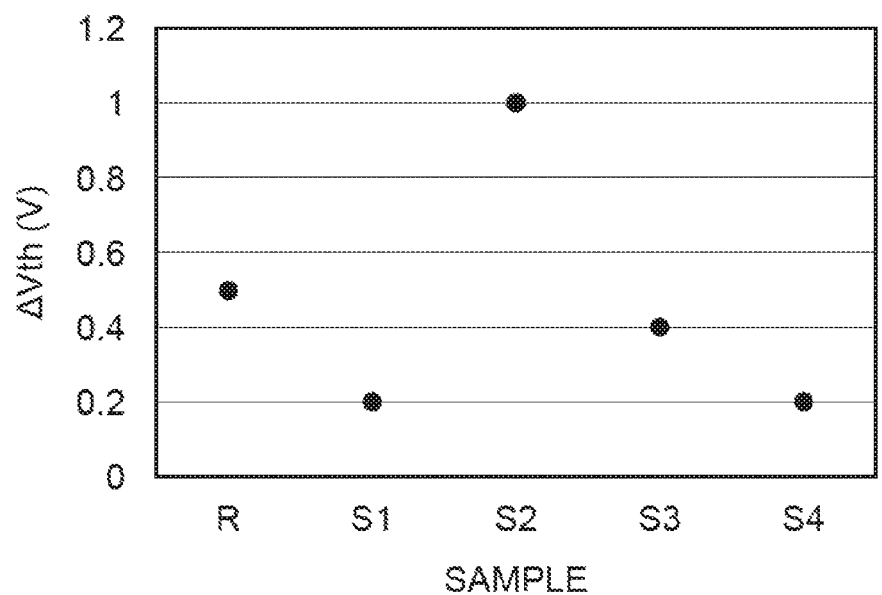

Then the threshold voltages were measured for five times regarding each of the reference sample R and the samples S1 to S4. Results thereof are illustrated in FIG. 9A and FIG. 9B. In FIG. 9A, deviation amounts (shift amounts) of the threshold voltages where the threshold voltage measured at a first time in the reference sample R is set as a reference are illustrated. In FIG. 9B, a variation amount ΔVth of the threshold voltage between the first measurement and the fifth measurement in each of the reference sample R and the samples S1 to S4 are illustrated.

As is obvious from FIG. 9A, the heat treatment of the insulating film and the containing anion have an effect making the threshold voltage shallower. As is obvious from FIG. 9B, the process of the surface of the carrier supply layer and the containing anion have an effect suppressing the variation of the threshold voltage. Accordingly, it may be said that it is possible to make the threshold voltage shallow and to suppress the variation of the threshold voltage by using an insulating film containing anion.

Second Experiment

In a second experiment, an effect of the amount of the anion contained in the insulating film exerted on the sheet resistance was examined. Specifically, samples where fluorine ion was contained in an insulating film at various concentrations were prepared, sheet resistances (Rs) of them were measured, and ratios (Rs/Rs$_R$) to a sheet resistance (Rs$_R$) of the reference sample R of the first experiment were found. Results thereof are illustrated in FIG. 10.

Figure 10:
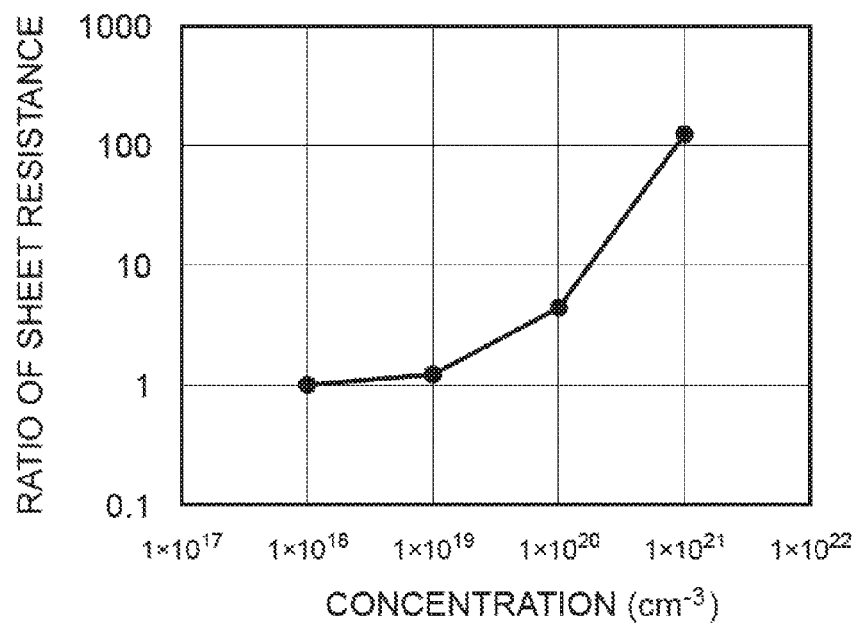
FIG. 10 is a drawing illustrating a result of a second experiment.

As illustrated in FIG. 10, when the concentration of the fluorine ion is $1 \times 10^{19}$ cm$^{-3}$ or less, the increase in the sheet resistance is slight, and fine characteristics are obtained. Anion is used to terminate in-film defects in the insulating film (unpaired electrons). The concentration of the in-film defects in the insulating film is in an order of approximately $1 \times 10^{19}$ cm$^{-3}$, and therefore, the anion at approximately the same concentration is consumed for the termination. When the anion excessively exists relative to the in-film defects, the sheet resistance increases because a band is increased or a repulsive force acts on 2DEG due to the excessive anion. Accordingly, anion may be contained at a concentration of $1 \times 10^{19}$ cm$^{-3}$ or less. When the concentration of the anion is $1 \times 10^{21}$ cm$^{-3}$ or more, the normally-off operation may occur. Accordingly, anion may be contained at a concentration of $1 \times 10^{21}$ cm$^{-3}$ or more so as to enable the normally-off operation.

Third Experiment

Figure 11:
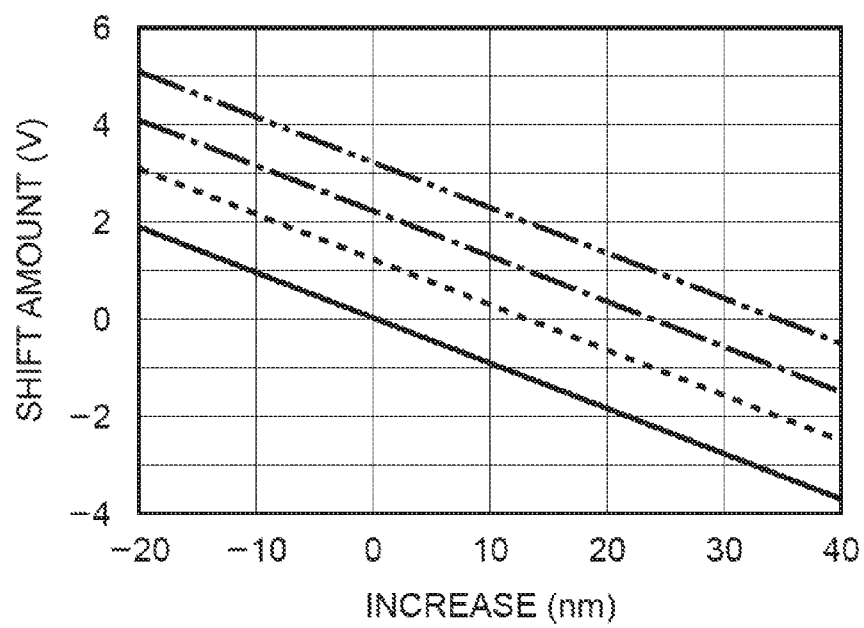
FIG. 11 is a drawing illustrating a result of a third experiment.

In a third experiment, effects of the thickness of the insulating film and the anion concentration exerted on the threshold voltage were examined. Specifically, a silicon nitride film was used as the insulating film, fluorine ion was used as the anion, and a relationship between increase/decrease of the thickness of the silicon nitride film and a deviation amount (shift amount) of the threshold voltage was found while changing the concentration of the fluorine ion. Results thereof are illustrated in FIG. 11. A solid line in FIG. 11 illustrates a result corresponding to the sample S2 when the concentration of the fluorine ion was "0" (zero) cm$^{-3}$, a dotted line illustrates a result when the concentration of the fluorine ion was $5 \times 10^{18}$ cm$^{-3}$, a one-dot chain line illustrates a result when the concentration of the fluorine ion was $1 \times 10^{19}$ cm$^{-3}$, and a two-dot chain line illustrates a result when the concentration of the fluorine ion was $1.5 \times 10^{19}$ cm$^{-3}$. As is obvious from FIG. 11, the threshold voltage becomes shallower as the concentration of the fluorine ion becomes higher, and the threshold voltage becomes deeper as the thickness of the insulating film becomes thicker. It is therefore possible to make the threshold voltage shallow by having the fluorine ion contained even when the insulating film is thickened so as to improve the withstand voltage, to reduce the gate leakage current.

Fourth Embodiment

Figure 12:
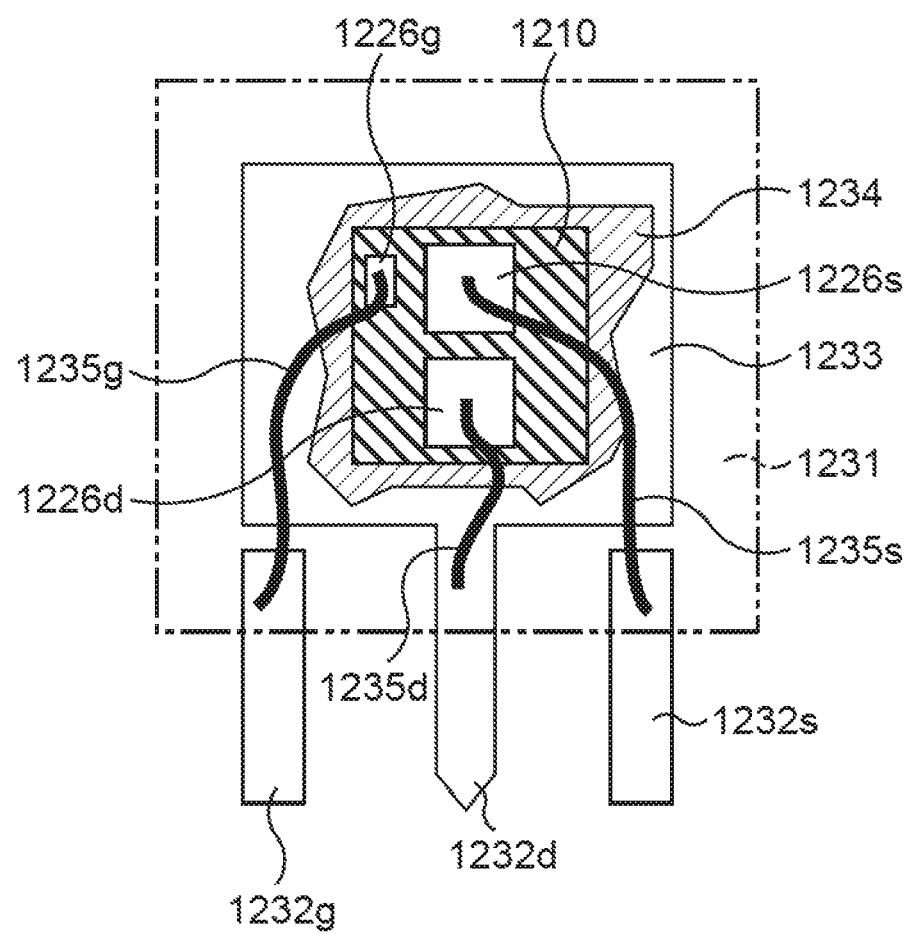
FIG. 12 is a view illustrating a discrete package according to a fourth embodiment.

Next, a fourth embodiment is described. The fourth embodiment relates to a discrete package of a compound semiconductor device which includes an HEMT. FIG. 12 is a view illustrating the discrete package according to the fourth embodiment.

In the fourth embodiment, as illustrated in FIG. 12, a back surface of a HEMT chip 1210 of the compound semiconductor device according to any one of the first to third embodiments is fixed on a land (die pad) 1233, using a die attaching agent 1234 such as solder. One end of a wire 1235$d$ such as an Al wire is bonded to a drain pad 1226$d$, to which the drain electrode 113, 213 or 313 is connected, and the other end of the wire 1235$d$ is bonded to a drain lead 1232$d$ integral with the land 1233. One end of a wire 1235$s$ such as an Al wire is bonded to a source pad 1226$s$, to which the source electrode 112, 212 or 312 is connected, and the other end of the wire 1235$s$ is bonded to a source lead 1232$s$ separated from the land 1233. One end of a wire 1235$g$ such as an Al wire is bonded to a gate pad 1226$g$, to which the gate electrode 111, 211 or 311 is connected, and the other end of the wire 1235$g$ is bonded to a gate lead 1232$g$ separated from the land 1233. The land 1233, the HEMT chip 1210 and so forth are packaged with a molding resin 1231, so as to project outwards a portion of the gate lead 1232$g$, a portion of the drain lead 1232$d$, and a portion of the source lead 1232$s$.

The discrete package may be manufactured by the procedures below, for example. First, the HEMT chip 1210 is bonded to the land 1233 of a lead frame, using a die attaching agent 1234 such as solder. Next, with the wires 1235$g$, 1235$d$ and 1235$s$, the gate pad 1226$g$ is connected to the gate lead 1232$g$ of the lead frame, the drain pad 1226$d$ is connected to the drain lead 1232$d$ of the lead frame, and the source pad 1226$s$ is connected to the source lead 1232$s$ of the lead frame, respectively, by wire bonding. The molding with the molding resin 1231 is conducted by a transfer molding process. The lead frame is then cut away.

Fifth Embodiment

Figure 13:
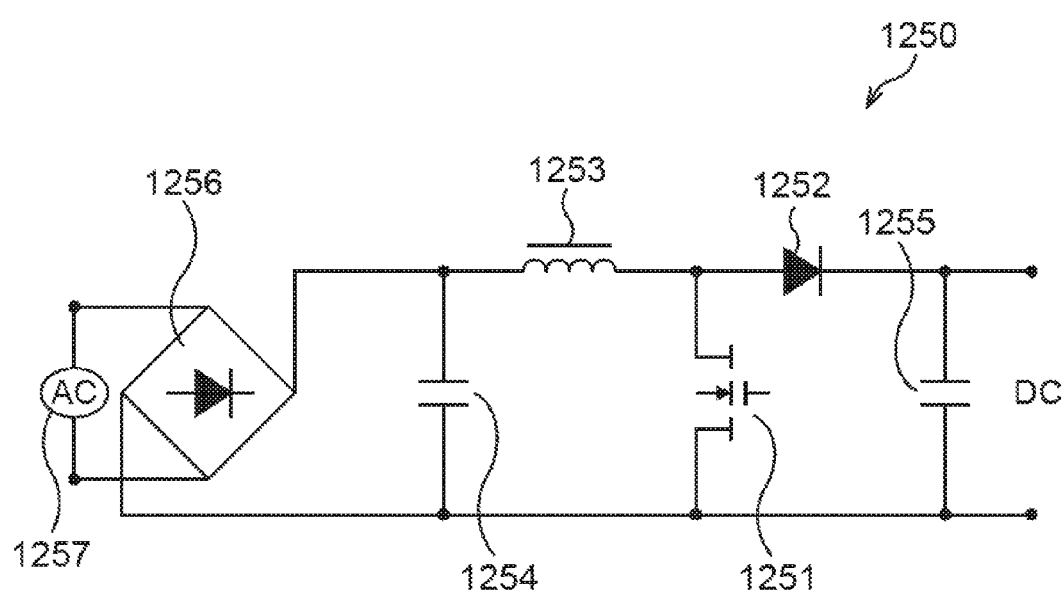
FIG. 13 is a wiring diagram illustrating a PFC circuit according to a fifth embodiment.

Next, a fifth embodiment is described. The fifth embodiment relates to a power factor correction (PFC) circuit equipped with a compound semiconductor device which includes an HEMT. FIG. 13 is a wiring diagram illustrating the PFC circuit according to the fifth embodiment.

A PFC circuit 1250 has a switching element (transistor) 1251, a diode 1252, a choke coil 1253, capacitors 1254 and 1255, a diode bridge 1256, and an AC power source (AC) 1257. The drain electrode of the switching element 1251, the anode terminal of the diode 1252, and one terminal of the choke coil 1253 are connected with each other. The source electrode of the switching element 1251, one terminal of the capacitor 1254, and one terminal of the capacitor 1255 are connected with each other. The other terminal of the capacitor 1254 and the other terminal of the choke coil 1253 are connected with each other. The other terminal of the capacitor 1255 and the cathode terminal of the diode 1252 are connected with each other. A gate driver is connected to the gate electrode of the switching element 1251. The AC 1257 is connected between both terminals of the capacitor 1254 via the diode bridge 1256. A DC power source (DC) is connected between both terminals of the capacitor 1255. In the embodiment, the compound semiconductor device according to any one of the first to third embodiments is used as the switching element 1251.

In the method of manufacturing the PFC circuit 1250, for example, the switching element 1251 is connected to the diode 1252, the choke coil 1253 and so forth with solder, for example.

Sixth Embodiment

Figure 14:
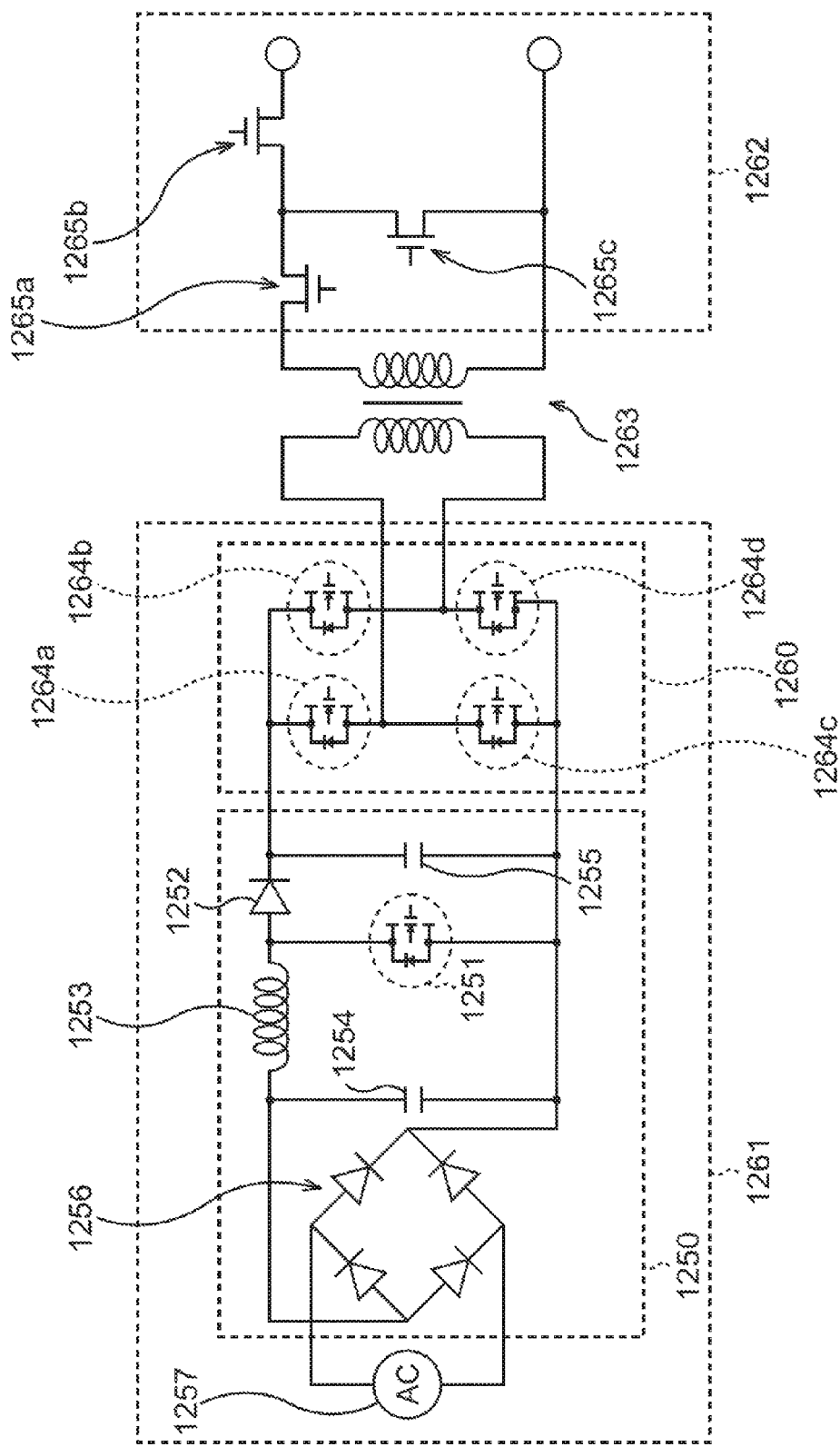
FIG. 14 is a wiring diagram illustrating a power supply apparatus according to a sixth embodiment.

Next, a sixth embodiment is described. The sixth embodiment relates to a power supply apparatus equipped with a compound semiconductor device which includes an HEMT. FIG. 14 is a wiring diagram illustrating the power supply apparatus according to the sixth embodiment.

The power supply apparatus includes a high-voltage, primary-side circuit 1261, a low-voltage, secondary-side circuit 1262, and a transformer 1263 arranged between the primary-side circuit 1261 and the secondary-side circuit 1262.

The primary-side circuit 1261 includes the PFC circuit 1250 according to the fifth embodiment, and an inverter circuit, which may be a full-bridge inverter circuit 1260, for example, connected between both terminals of the capacitor 1255 in the PFC circuit 1250. The full-bridge inverter circuit 1260 includes a plurality of (four, in the embodiment) switching elements 1264a, 1264b, 1264c and 1264d.

The secondary-side circuit 1262 includes a plurality of (three, in the embodiment) switching elements 1265a, 1265b and 1265c.

In the embodiment, the compound semiconductor device according to any one of first to third embodiments is used for the switching element 1251 of the PFC circuit 1250, and for the switching elements 1264a, 1264b, 1264c and 1264d of the full-bridge inverter circuit 1260. The PFC circuit 1250 and the full-bridge inverter circuit 1260 are components of the primary-side circuit 1261. On the other hand, a silicon-based general MIS-FET (field effect transistor) is used for the switching elements 1265a, 1265b and 1265c of the secondary-side circuit 1262.

Seventh Embodiment

Figure 15:
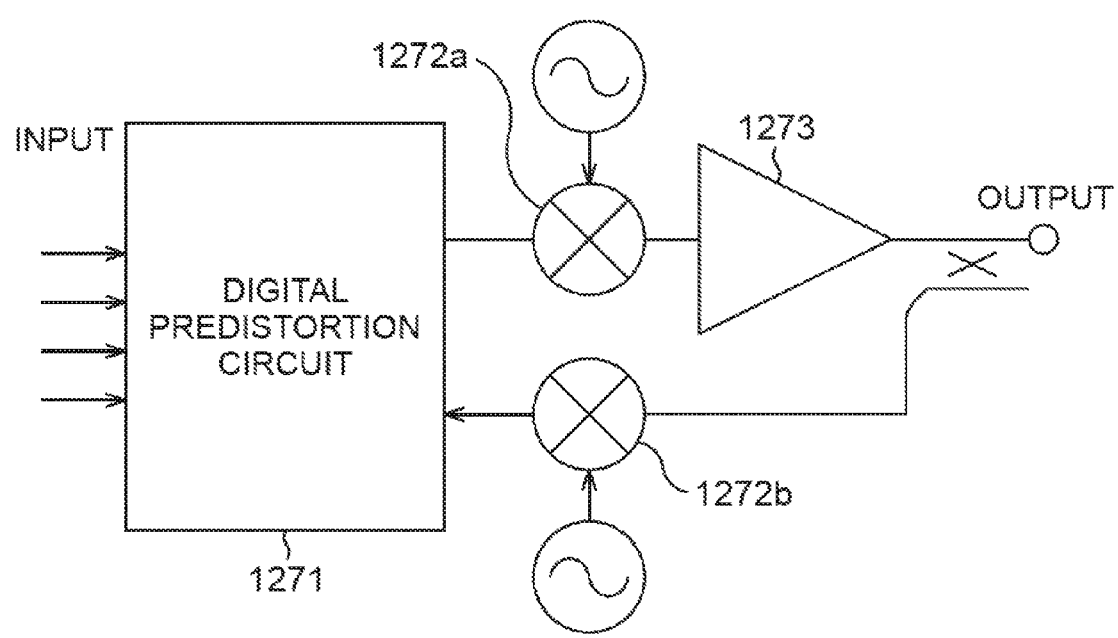
FIG. 15 is a wiring diagram illustrating an amplifier according to a seventh embodiment.

Next, a seventh embodiment is explained. The seventh embodiment relates to an amplifier equipped with the compound semiconductor device which includes an HEMT. FIG. 15 is a wiring diagram illustrating the amplifier according to the seventh embodiment.

The amplifier includes a digital predistortion circuit 1271, mixers 1272a and 1272b, and a power amplifier 1273.

The digital predistortion circuit 1271 compensates non-linear distortion in input signals. The mixer 1272a mixes the input signal having the non-linear distortion already compensated, with an AC signal. The power amplifier 1273 includes the compound semiconductor device according to any one of the first to third embodiments, and amplifies the input signal mixed with the AC signal. In the embodiment, the signal on the output side may be mixed, upon switching, with an AC signal by the mixer 1272b, and may be sent back to the digital predistortion circuit 1271. The amplifier may be used as a high-frequency amplifier or a high-output amplifier.

According to the above-stated compound semiconductor device or the like, a specific first region and second region are included in an insulating film, and therefore, it is possible to make a threshold voltage shallow while avoiding increase in a gate leakage current, lowering of a withstand voltage and increase in a sheet resistance.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a substrate;
   a channel layer over the substrate;
   a carrier supply layer over the channel layer;
   a gate electrode, a source electrode and a drain electrode above the channel layer and the carrier supply layer; and
   an insulating film that covers the carrier supply layer between the source electrode and the drain electrode,
   wherein the insulating film comprises:
   a first region that contains anion under the gate electrode; and
   a second region on the source electrode side or on the drain electrode side of the first region in planar view, a whole of the second region being anion-free in a thickness direction of the insulating film, and
   wherein the first region comprises a plurality of layers whose anion concentrations are different from one another.

2. The compound semiconductor device according to claim 1, wherein the first region is formed only at a part of the insulating film overlapping the gate electrode in planar view.

3. The compound semiconductor device according to claim 1, wherein the first region is thinner than the second region.

4. The compound semiconductor device according to claim 1, wherein the carrier supply layer comprises a third region that contains anion under the gate electrode.

5. The compound semiconductor device according to claim 1, wherein the anion is halogen ion.

6. The compound semiconductor device according to claim 1, wherein the first region contains fluorine ion at a concentration of $1 \times 10^{18}$ cm$^{-3}$ to $1 \times 10^{19}$ cm$^{-3}$.

7. A power supply apparatus, comprising
   a compound semiconductor device, wherein the compound semiconductor device comprises:
   a substrate;
   a channel layer over the substrate;
   a carrier supply layer over the channel layer;
   a gate electrode, a source electrode and a drain electrode above the channel layer and the carrier supply layer; and
   an insulating film that covers the carrier supply layer between the source electrode and the drain electrode,
   wherein the insulating film comprises:
   a first region that contains anion under the gate electrode; and
   a second region on the source electrode side or on the drain electrode side of the first region in planar view, a whole of the second region being anion-free in a thickness direction of the insulating film, and
   wherein the first region comprises a plurality of layers whose anion concentrations are different from one another.

8. An amplifier, comprising
   a compound semiconductor device, wherein the compound semiconductor device comprises:
   a substrate;
   a channel layer over the substrate;
   a carrier supply layer over the channel layer;
   a gate electrode, a source electrode and a drain electrode above the channel layer and the carrier supply layer; and an insulating film that covers the carrier supply layer between the source electrode and the drain electrode, wherein the insulating film comprises:

a first region that contains anion under the gate electrode; and a second region on the source electrode side or on the drain electrode side of the first region in planar view, a whole of the second region being anion-free in a thickness direction of the insulating film, and wherein the first region comprises a plurality of layers whose anion concentrations are different from one another.

* * * * *